(12) United States Patent
Dunn et al.

(10) Patent No.: US 9,299,275 B2
(45) Date of Patent: Mar. 29, 2016

(54) DISPLAY APPARATUS INCORPORATING CORRUGATED BEAM ACTUATORS

(71) Applicant: Pixtronix, Inc., San Diego, CA (US)

(72) Inventors: Tyler Dunn, North Reading, MA (US); Mark B. Andersson, Northborough, MA (US)

(73) Assignee: Pixtronix, Inc., San Diego, CA (US)

( * ) Notice: Subject to any disclaimer, the term of this patent is extended or adjusted under 35 U.S.C. 154(b) by 200 days.

(21) Appl. No.: 14/146,362

(22) Filed: Jan. 2, 2014

(65) Prior Publication Data

US 2015/0187239 A1 Jul. 2, 2015

(51) Int. Cl.
| | |
|---|---|
| *G02B 26/02* | (2006.01) |
| *G09F 9/37* | (2006.01) |
| *B81B 3/00* | (2006.01) |
| *H02N 1/00* | (2006.01) |
| *G02B 26/04* | (2006.01) |

(52) U.S. Cl.
CPC ............. *G09F 9/372* (2013.01); *B81B 3/0021* (2013.01); *G02B 26/04* (2013.01); *H02N 1/002* (2013.01); *B81B 2201/038* (2013.01)

(58) Field of Classification Search
CPC ........... G02B 26/0941; G02B 26/0833; G02B 26/10; G02B 26/04; G02B 26/02; B81B 3/0086; G09F 9/372
USPC .................................... 359/223.1–226.1, 230
See application file for complete search history.

(56) References Cited

U.S. PATENT DOCUMENTS

| | | | |
|---|---|---|---|
| 6,300,154 B2 | 10/2001 | Clark et al. | |
| 7,538,471 B2 | 5/2009 | Kurozuka et al. | |
| 7,589,921 B2 | 9/2009 | Kwan et al. | |
| 2009/0002798 A1* | 1/2009 | Ohmori ................. | B81B 3/0086 359/226.1 |
| 2009/0152980 A1 | 6/2009 | Huang | |
| 2013/0050290 A1 | 2/2013 | Andersson et al. | |
| 2013/0147313 A1 | 6/2013 | Sachse | |
| 2013/0194649 A1 | 8/2013 | Zhou | |

OTHER PUBLICATIONS

International Search Report and Written Opinion—PCT/US2014/072367—ISA/EPO—Apr. 30, 2015.

* cited by examiner

*Primary Examiner* — Euncha Cherry
(74) *Attorney, Agent, or Firm* — Edward A. Gordon; Foley & Lardner LLP

(57) ABSTRACT

This disclosure provides systems, methods and apparatus for shutter-based EMS light modulators controlled by electrode actuators that include complementary sets of corrugations or teeth along the opposing beams of the actuators. The complementary sets of corrugations substantially engage one another when drawn together via an actuation voltage. By applying the actuation voltage across the opposing beams of such an actuator, the beams are drawn together both by the electromotive force resulting from the electric field acting between the portions of the beams that are substantially perpendicular to the direction of actuation of the actuator, and by fringing fields between the sides of the corrugations, which are substantially parallel to the direction of actuation. The additional fringing fields provide for increased electromotive force for a given input voltage.

20 Claims, 14 Drawing Sheets

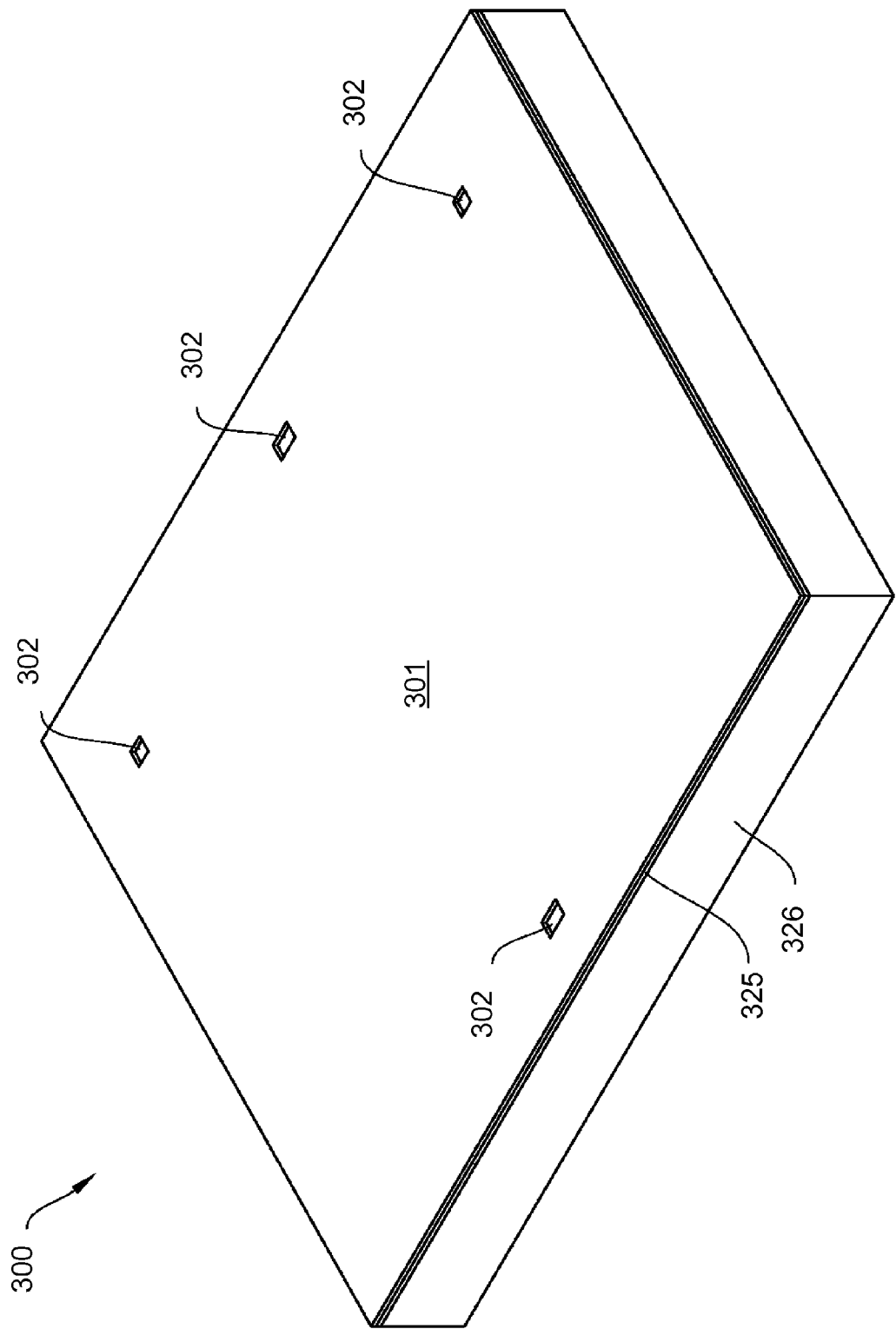

DISPLAY APPARATUS INCORPORATING CORRUGATED BEAM ACTUATORS

TECHNICAL FIELD

This disclosure relates to the field of displays, and in particular, electromechanical systems (EMS) display elements.

DESCRIPTION OF THE RELATED TECHNOLOGY

Electromechanical systems (EMS) devices include devices having electrical and mechanical elements, such as actuators, optical components (such as mirrors, shutters, and/or optical film layers) and electronics. EMS devices can be manufactured at a variety of scales including, but not limited to, microscales and nanoscales. For example, microelectromechanical systems (MEMS) devices can include structures having sizes ranging from about a micron to hundreds of microns or more. Nanoelectromechanical systems (NEMS) devices can include structures having sizes smaller than a micron including, for example, sizes smaller than several hundred nanometers. Electromechanical elements may be created using deposition, etching, lithography, and/or other micromachining processes that etch away parts of deposited material layers, or that add layers to form electrical and electromechanical devices.

EMS-based display apparatus have been proposed that include display elements that modulate light by selectively moving a light blocking component into and out of an optical path through an aperture defined through a light blocking layer. Doing so selectively passes light from a backlight or reflects light from the ambient or a front light to form an image.

Certain displays are designed to generate images by modulating light using shutters. These shutters are supported and actuated by shutter assemblies that, in addition to a shutter, include actuators for actuating the shutter, and anchors for supporting the shutter over a substrate.

SUMMARY

The systems, methods and devices of the disclosure each have several innovative aspects, no single one of which is solely responsible for the desirable attributes disclosed herein.

One innovative aspect of the subject matter described in this disclosure can be implemented in a display apparatus. The display apparatus includes a light obstructing component suspended over a substrate and an actuator configured to move the light obstructing component in a plane substantially parallel to the substrate. The actuator includes a first compliant beam electrode and a second compliant beam electrode. The first compliant beam electrode is coupled to the light obstructing component and includes a first primary elongated portion. The first primary elongated portion includes a first set of corrugations along a length of the first compliant beam electrode. The first compliant beam electrode defines a perimeter of the first set of corrugations. The second compliant beam electrode of the actuator is positioned adjacent to the first compliant beam electrode. The second compliant beam electrode includes a second primary elongated portion having a second set of corrugations. The second compliant beam electrode defines a perimeter of the second set of corrugations. The first and second sets of corrugations are positioned along the first and second primary elongated portions at positions selected such that when the first and second compliant beam electrodes are drawn together, the first and second sets of corrugations substantially engage one another.

In some implementations, the second primary elongated portion of the second compliant beam electrode can extend outward from an anchor. The anchor may support the second compliant beam electrode over the substrate. The second compliant beam electrode can, in some implementations, also include a third primary elongated portion. The third primary elongated portion can extend back from the distal end of the second primary elongated portion towards the anchor. In some implementations, the third primary elongated portion can include a third set of corrugations along a length of the third primary elongated portion.

In some implementations, each of the first and second sets of corrugations can include a plurality of protrusions. The protrusions can have depths that are at least four times their respective thickness. In some implementations, protrusions in the first and second sets of corrugations are spaced at least about 3 microns apart from a nearest adjacent protrusion along the respective lengths of the first and second primary elongated portions of the first and second compliant beam electrodes. In some implementations, protrusions in the first and second sets of corrugations can be one of triangular, rectangular, or U-shaped.

In some implementations, the first compliant beam electrode and the second compliant beam electrode can be configured to be drawn together. The first compliant beam electrode and the second compliant beam electrode can be drawn together in response to a voltage applied across the first and second compliant beam electrodes. In some implementations, the first compliant beam electrode and the second compliant beam electrode are configured to be drawn together in a plane substantially parallel to the substrate.

In some implementations, the display apparatus can include a display, a processor and a memory device. The processor can be configured to communicate with the display and process image data. The memory device can be configured to communicate with the processor. In some implementations, the display apparatus can also include a driver circuit and a controller. The driver circuit can be configured to send at least one signal to the display. The controller can be configured to send at least a portion of the image data to the driver circuit. In some implementations, the display apparatus includes an image source module that can be configured to send the image data to the processor. The image source module can include at least one of a receiver, transceiver, and transmitter. In some implementations, the display apparatus can include an input device. The input device can be configured to receive input data and to communicate the input data to the processor.

Another innovative aspect of the subject matter described in this disclosure can be implemented in a method of forming a display apparatus. The method includes providing a substrate and forming a light obstructing component suspended over the substrate. The method includes forming a first compliant beam electrode coupled to the light obstructing component. The first compliant beam electrode includes a first primary elongated portion that includes a first set of corrugations along its length. The shape of the first primary elongated portion traces the perimeter contours of the first set of corrugations. The method also includes forming a second compliant beam electrode positioned adjacent to the first compliant beam electrode. The second compliant beam electrode includes a second primary elongated portion that includes a second set of corrugations. The shape of the second compliant beam electrode traces the perimeter contours of the second set of corrugations. The first and second sets of corrugations are positioned along the first and second primary elongated portions such that when the first and second compliant beam electrodes are drawn together, the first and second sets of corrugations substantially engage one another.

In some implementations, the method can include forming a rear elongated portion for the second compliant beam electrode. The rear elongated portion can loop back to an anchor that supports the second compliant beam electrode over the substrate. In some implementations, the method can include forming a third set of corrugations along the rear elongated portion. In some implementations, each of the first and second sets of corrugations includes a plurality of protrusions having a depth greater than their respective width. In some implementations, the first set of corrugations and the second set of corrugations can include protrusions that are one of triangular, rectangular, or U-shaped.

Another innovative aspect of the subject matter described in this disclosure can be implemented in a display apparatus. The display apparatus includes a light obstructing component suspended over a substrate and an actuator. The actuator is configured to move the light obstructing component in a plane substantially parallel to the substrate. The actuator includes a first compliant beam electrode coupled to the light obstructing component. The first compliant beam electrode has a first primary elongated portion, and the first compliant beam electrode defines a perimeter of the first primary elongated portion. The actuator includes a second compliant beam electrode positioned adjacent to the first compliant beam electrode. The second compliant beam electrode has a second primary elongated portion, and the second compliant beam electrode defines a perimeter of the second elongated portion. The first and second compliant beam electrodes include means for generating a first electromotive force resulting from an electric field between beam components which are substantially perpendicular to a direction of movement. The first and second compliant beams also include means for generating a second electromotive force that results from fringing fields between beam portions which are substantially parallel to the direction of movement. The first and second electromotive forces draw the first and second compliant beams together.

In some implementations, the first compliant beam electrode and the second compliant beam electrode can be configured to be drawn together in a plane substantially parallel to the substrate. In some implementations, the second primary elongated portion of the second compliant beam electrode can extend outward from an anchor supporting the second compliant beam electrode over the substrate. In some implementations, the second compliant beam electrode can also include a third primary elongated portion. The third primary elongated portion can extend back from the distal end of the second primary elongated portion towards the anchor.

Details of one or more implementations of the subject matter described in this specification are set forth in the accompanying drawings and the description below. Although the examples provided in this summary are primarily described in terms of MEMS-based displays, the concepts provided herein may apply to other types of displays, such as liquid crystal displays (LCD), organic light emitting diode (OLED) displays, electrophoretic displays, and field emission displays, as well as to other non-display MEMS devices, such as MEMS microphones, sensors, and optical switches. Other features, aspects, and advantages will become apparent from the description, the drawings, and the claims. Note that the relative dimensions of the following figures may not be drawn to scale.

BRIEF DESCRIPTION OF THE DRAWINGS

FIGS. 3A-3D show isomeric views of example stages of construction of an example shutter assembly.

Like reference numbers and designations in the various drawings indicate like elements.

DETAILED DESCRIPTION

Figure 1A:
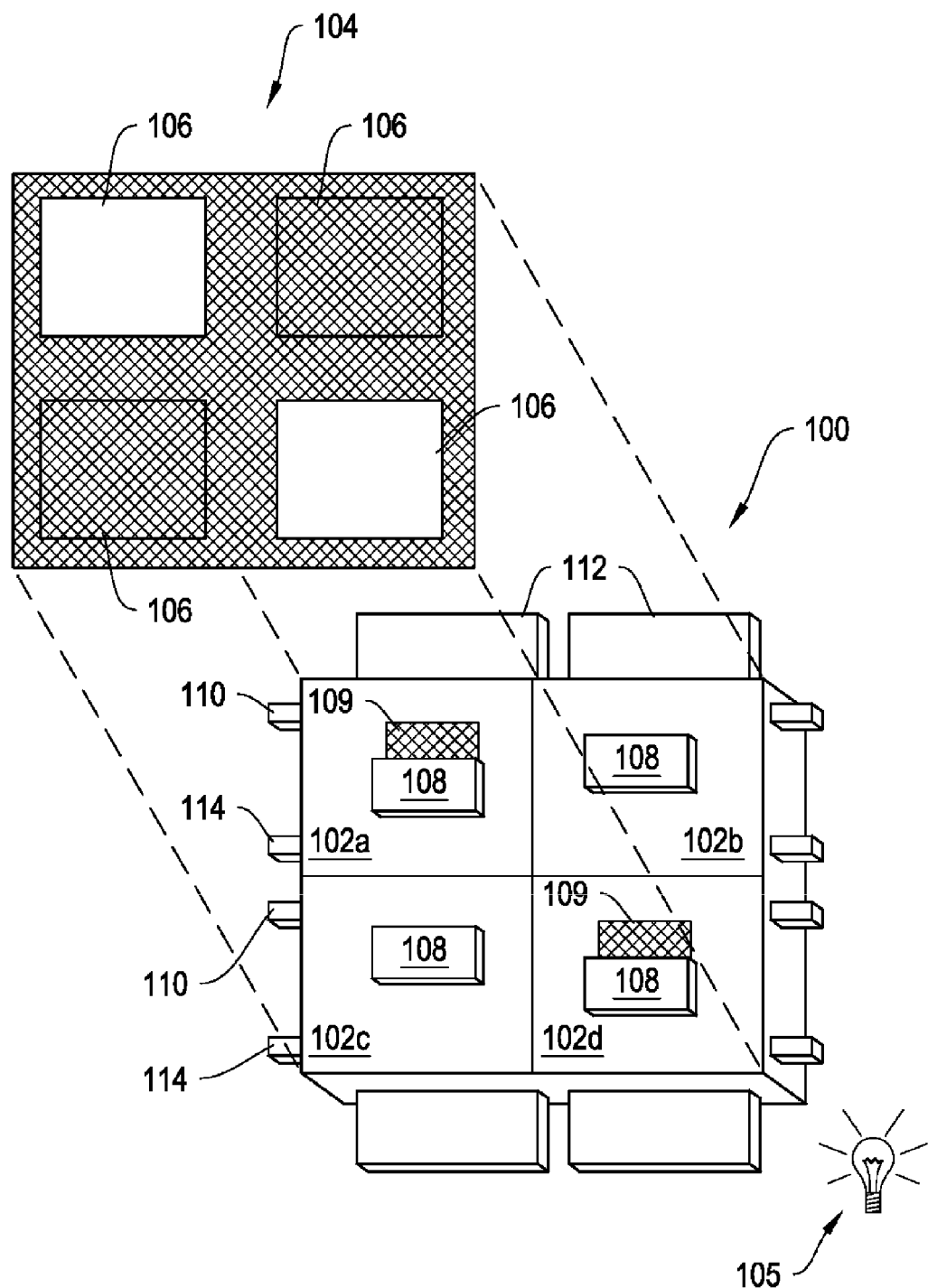
FIG. 1A shows a schematic diagram of an example direct-view microelectromechanical systems (MEMS) based display apparatus.

The following description is directed to certain implementations for the purposes of describing the innovative aspects of this disclosure. However, a person having ordinary skill in the art will readily recognize that the teachings herein can be applied in a multitude of different ways. The described implementations may be implemented in any device, apparatus, or system that can be configured to display an image, whether in motion (such as video) or stationary (such as still images), and whether textual, graphical or pictorial. More particularly, it is contemplated that the described implementations may be included in or associated with a variety of electronic devices such as, but not limited to: mobile telephones, multimedia Internet enabled cellular telephones, mobile television receivers, wireless devices, smartphones, Bluetooth® devices, personal data assistants (PDAs), wireless electronic mail receivers, hand-held or portable computers, netbooks, notebooks, smartbooks, tablets, printers, copiers, scanners, facsimile devices, global positioning system (GPS) receivers/navigators, cameras, digital media players (such as MP3 players), camcorders, game consoles, wrist watches, clocks, calculators, television monitors, flat panel displays, electronic reading devices (such as e-readers), computer monitors, auto displays (including odometer and speedometer displays, etc.), cockpit controls and/or displays, camera view displays (such as the display of a rear view camera in a vehicle), electronic photographs, electronic billboards or signs, projectors, architectural structures, microwaves, refrigerators, stereo systems, cassette recorders or players, DVD players, CD players, VCRs, radios, portable memory chips, washers, dryers, washer/dryers, parking meters, packaging (such as in electromechanical systems (EMS) applications including microelectromechanical systems (MEMS) applications, as well as non-EMS applications), aesthetic structures (such as display of images on a piece of jewelry or clothing) and a variety of EMS devices. The teachings herein also can be used in non-display applications such as, but not limited to, electronic switching devices, radio frequency filters, sensors, accelerometers, gyroscopes, motion-sensing devices, magnetometers, inertial components for consumer electronics, parts of consumer electronics products, varactors, liquid crystal devices, electrophoretic devices, drive schemes, manufacturing processes and electronic test equipment. Thus, the teachings are not intended to be limited to the implementations depicted solely in the Figures, but instead have wide applicability as will be readily apparent to one having ordinary skill in the art.

Shutter-based EMS displays that include light modulators controlled by electrode actuators (e.g., electrostatic zipper electrode actuators) can be fabricated to include complementary sets of corrugations or teeth along the opposing beams of the actuators. When drawn together via an actuation voltage, the corrugations substantially engage one another. When an actuation voltage is applied across the opposing beams of such an actuator, the beams are drawn together both by the electromotive force resulting from the electric field acting between the portions of the beams that are substantially perpendicular to the direction of actuation of the actuator and by fringing fields between the sides of the corrugations, which are substantially parallel to the direction of actuation. The additional fringing fields provide for increased electromotive force for a given input voltage, which may allow the actuator to operate at a lower actuation voltage and/or actuate at a higher speed than those without such corrugations.

A set of corrugations includes multiple protrusions. The number and shape of the protrusions, as well as the separation distance between the protrusions, can vary. For example, the protrusions can be rectangular, triangular, saw tooth, U-shaped, etc. In some implementations, the separation distance between the protrusions on a given beam electrode can be constant, while in other implementations the separation distance can vary. For example, the protrusions of a set of corrugations can increase in width from one end of the beam electrode to the other end of the beam electrode.

Particular implementations of the subject matter described in this disclosure can be implemented to realize one or more of the following potential advantages. In some implementations, incorporating corrugations into opposing beam electrodes can increase the amount of electrostatic force generated between the opposing beam electrodes from an input voltage, thereby increasing the ratio of electrostatic force generated to input voltage. The additional force generated for a given input voltage allows the actuator to operate with a reduced actuation voltage and/or with an increased actuation speed. The set of corrugations can also reduce the stiffness of the beams, reducing the force needed to actuate the actuator. In some implementations, a set of corrugations on the rear side of a looped beam electrode can help position the beam by leveraging stress gradients in the beam. The stress gradients can tend to bend the beam towards the opposing beam.

In some implementations, various corrugation shapes can provide additional advantages. For example, electrodes having triangular or saw tooth corrugation, rather than rectangular corrugations, can be advantageous because opposing corrugations need not be aligned to as great a tolerance while still providing reliable operation. As the point of one triangular corrugation is pulled against an angled edge of an opposing triangular corrugation, the point of the triangular corrugation can slide down the opposing edge until the triangular corrugations are fully engaged. By contrast, the ends of misaligned rectangular corrugations may be drawn directly into contact with one another, preventing the corrugations from engaging.

FIG. 1A shows a schematic diagram of an example direct-view MEMS-based display apparatus 100. The display apparatus 100 includes a plurality of light modulators 102a-102d (generally "light modulators 102") arranged in rows and columns. In the display apparatus 100, the light modulators 102a and 102d are in the open state, allowing light to pass. The light modulators 102b and 102c are in the closed state, obstructing the passage of light. By selectively setting the states of the light modulators 102a-102d, the display apparatus 100 can be utilized to form an image 104 for a backlit display, if illuminated by a lamp or lamps 105. In another implementation, the apparatus 100 may form an image by reflection of ambient light originating from the front of the apparatus. In another implementation, the apparatus 100 may form an image by reflection of light from a lamp or lamps positioned in the front of the display, i.e., by use of a front light.

In some implementations, each light modulator 102 corresponds to a pixel 106 in the image 104. In some other implementations, the display apparatus 100 may utilize a plurality of light modulators to form a pixel 106 in the image 104. For example, the display apparatus 100 may include three color-specific light modulators 102. By selectively opening one or more of the color-specific light modulators 102 corresponding to a particular pixel 106, the display apparatus 100 can generate a color pixel 106 in the image 104. In another example, the display apparatus 100 includes two or more light modulators 102 per pixel 106 to provide luminance level in an image 104. With respect to an image, a "pixel" corresponds to the smallest picture element defined by the resolution of image. With respect to structural components of the display apparatus 100, the term "pixel" refers to the combined mechanical and electrical components utilized to modulate the light that forms a single pixel of the image.

The display apparatus 100 is a direct-view display in that it may not include imaging optics typically found in projection applications. In a projection display, the image formed on the surface of the display apparatus is projected onto a screen or onto a wall. The display apparatus is substantially smaller than the projected image. In a direct view display, the user sees the image by looking directly at the display apparatus, which contains the light modulators and optionally a backlight or front light for enhancing brightness and/or contrast seen on the display.

Direct-view displays may operate in either a transmissive or reflective mode. In a transmissive display, the light modulators filter or selectively block light which originates from a lamp or lamps positioned behind the display. The light from the lamps is optionally injected into a lightguide or "backlight" so that each pixel can be uniformly illuminated. Transmissive direct-view displays are often built onto transparent or glass substrates to facilitate a sandwich assembly arrangement where one substrate, containing the light modulators, is positioned directly on top of the backlight.

Each light modulator 102 can include a shutter 108 and an aperture 109. To illuminate a pixel 106 in the image 104, the shutter 108 is positioned such that it allows light to pass through the aperture 109 towards a viewer. To keep a pixel 106 unlit, the shutter 108 is positioned such that it obstructs the passage of light through the aperture 109. The aperture 109 is defined by an opening patterned through a reflective or light-absorbing material in each light modulator 102.

The display apparatus also includes a control matrix connected to the substrate and to the light modulators for controlling the movement of the shutters. The control matrix includes a series of electrical interconnects (e.g., interconnects 110, 112 and 114), including at least one write-enable interconnect 110 (also referred to as a "scan-line interconnect") per row of pixels, one data interconnect 112 for each column of pixels, and one common interconnect 114 providing a common voltage to all pixels, or at least to pixels from both multiple columns and multiples rows in the display apparatus 100. In response to the application of an appropriate voltage (the "write-enabling voltage, VWE"), the write-enable interconnect 110 for a given row of pixels prepares the pixels in the row to accept new shutter movement instructions. The data interconnects 112 communicate the new movement instructions in the form of data voltage pulses. The data voltage pulses applied to the data interconnects 112, in some implementations, directly contribute to an electrostatic movement of the shutters. In some other implementations, the data voltage pulses control switches, e.g., transistors or other non-linear circuit elements that control the application of separate actuation voltages, which are typically higher in magnitude than the data voltages, to the light modulators 102. The application of these actuation voltages then results in the electrostatic driven movement of the shutters 108.

Figure 1B:
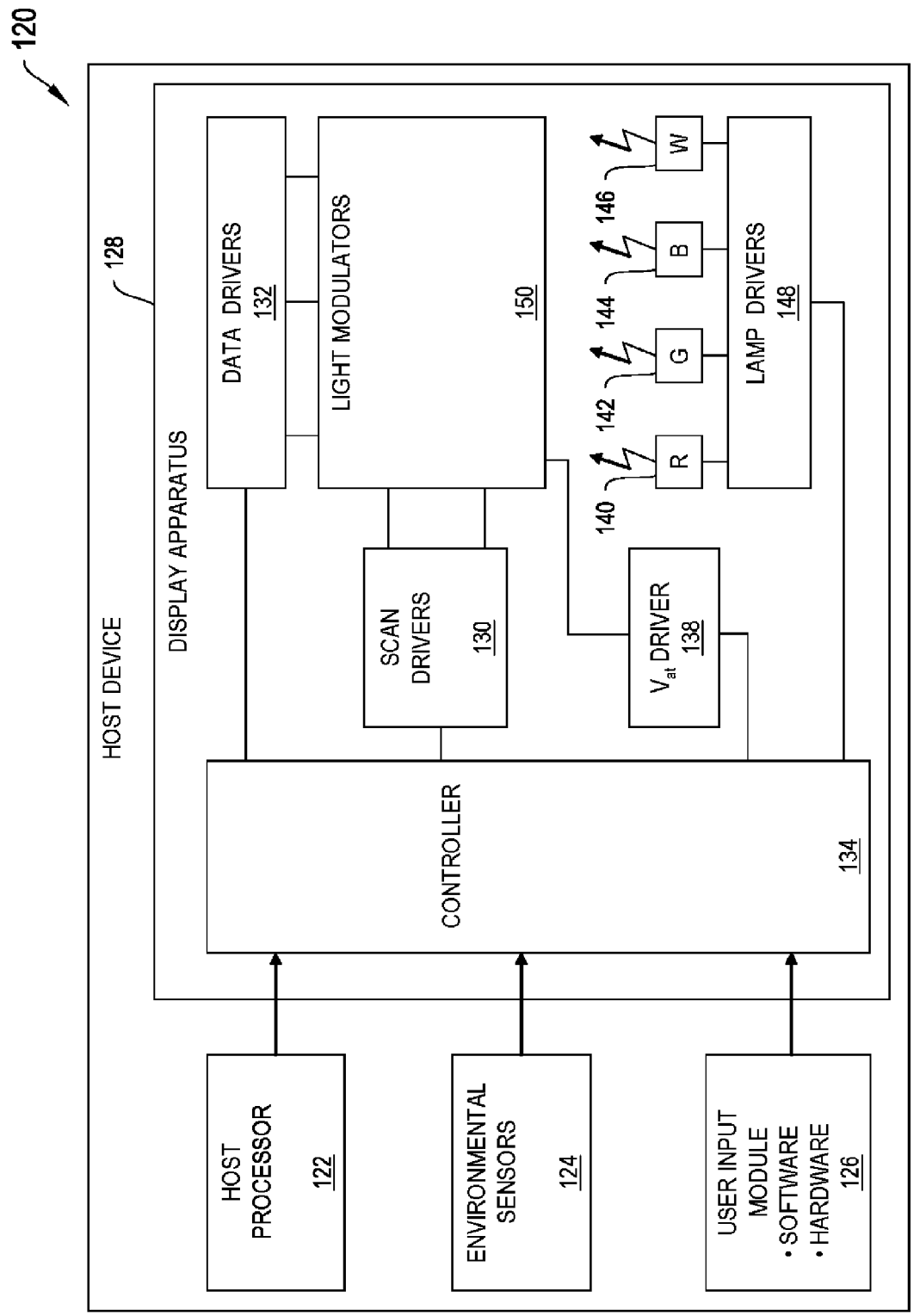
FIG. 1B shows a block diagram of an example host device.

FIG. 1B shows a block diagram of an example host device 120 (i.e., cell phone, smart phone, PDA, MP3 player, tablet, e-reader, netbook, notebook, etc.). The host device 120 includes a display apparatus 128, a host processor 122, environmental sensors 124, a user input module 126, and a power source.

The display apparatus 128 includes a plurality of scan drivers 130 (also referred to as "write enabling voltage sources"), a plurality of data drivers 132 (also referred to as "data voltage sources"), a controller 134, common drivers 138, lamps 140-146, lamp drivers 148 and an array 150 of display elements, such as the light modulators 102 shown in FIG. 1A. The scan drivers 130 apply write enabling voltages to scan-line interconnects 110. The data drivers 132 apply data voltages to the data interconnects 112.

In some implementations of the display apparatus, the data drivers 132 are configured to provide analog data voltages to the array 150 of display elements, especially where the luminance level of the image 104 is to be derived in analog fashion. In analog operation, the light modulators 102 are designed such that when a range of intermediate voltages is applied through the data interconnects 112, there results a range of intermediate open states in the shutters 108 and therefore a range of intermediate illumination states or luminance levels in the image 104. In other cases, the data drivers 132 are configured to apply only a reduced set of 2, 3 or 4 digital voltage levels to the data interconnects 112. These voltage levels are designed to set, in digital fashion, an open state, a closed state, or other discrete state to each of the shutters 108.

The scan drivers 130 and the data drivers 132 are connected to a digital controller circuit 134 (also referred to as the "controller 134"). The controller sends data to the data drivers 132 in a mostly serial fashion, organized in sequences, which in some implementations can be predetermined, grouped by rows and by image frames. The data drivers 132 can include series to parallel data converters, level shifting, and for some applications digital to analog voltage converters.

The display apparatus optionally includes a set of common drivers 138, also referred to as common voltage sources. In some implementations, the common drivers 138 provide a DC common potential to all display elements within the array 150 of display elements, for instance by supplying voltage to a series of common interconnects 114. In some other implementations, the common drivers 138, following commands from the controller 134, issue voltage pulses or signals to the array 150 of display elements, for instance global actuation pulses which are capable of driving and/or initiating simultaneous actuation of all display elements in multiple rows and columns of the array 150.

All of the drivers (e.g., scan drivers 130, data drivers 132 and common drivers 138) for different display functions are time-synchronized by the controller 134. Timing commands from the controller coordinate the illumination of red, green and blue and white lamps (140, 142, 144 and 146 respectively) via lamp drivers 148, the write-enabling and sequencing of specific rows within the array 150 of display elements, the output of voltages from the data drivers 132, and the output of voltages that provide for display element actuation. In some implementations, the lamps are light emitting diodes (LEDs).

The controller 134 determines the sequencing or addressing scheme by which each of the shutters 108 can be re-set to the illumination levels appropriate to a new image 104. New images 104 can be set at periodic intervals. For instance, for video displays, the color images 104 or frames of video are refreshed at frequencies ranging from 10 to 300 Hertz (Hz). In some implementations the setting of an image frame to the array 150 is synchronized with the illumination of the lamps 140, 142, 144 and 146 such that alternate image frames are illuminated with an alternating series of colors, such as red, green, and blue. The image frames for each respective color is referred to as a color subframe. In this method, referred to as the field sequential color method, if the color subframes are alternated at frequencies in excess of 20 Hz, the human brain will average the alternating frame images into the perception of an image having a broad and continuous range of colors. In alternate implementations, four or more lamps with primary colors can be employed in display apparatus 100, employing primaries other than red, green, and blue.

In some implementations, where the display apparatus 100 is designed for the digital switching of shutters 108 between open and closed states, the controller 134 forms an image by the method of time division gray scale, as previously described. In some other implementations, the display apparatus 100 can provide gray scale through the use of multiple shutters 108 per pixel.

In some implementations, the data for an image state 104 is loaded by the controller 134 to the display element array 150 by a sequential addressing of individual rows, also referred to as scan lines. For each row or scan line in the sequence, the scan driver 130 applies a write-enable voltage to the write enable interconnect 110 for that row of the array 150, and subsequently the data driver 132 supplies data voltages, corresponding to desired shutter states, for each column in the selected row. This process repeats until data has been loaded for all rows in the array 150. In some implementations, the sequence of selected rows for data loading is linear, proceeding from top to bottom in the array 150. In some other implementations, the sequence of selected rows is pseudo-randomized, in order to minimize visual artifacts. And in some other implementations the sequencing is organized by blocks, where, for a block, the data for only a certain fraction of the image state 104 is loaded to the array 150, for instance by addressing only every 5th row of the array 150 in sequence.

In some implementations, the process for loading image data to the array 150 is separated in time from the process of actuating the display elements in the array 150. In these implementations, the display element array 150 may include data memory elements for each display element in the array 150 and the control matrix may include a global actuation interconnect for carrying trigger signals, from common driver 138, to initiate simultaneous actuation of shutters 108 according to data stored in the memory elements.

In alternative implementations, the array 150 of display elements and the control matrix that controls the display elements may be arranged in configurations other than rectangular rows and columns. For example, the display elements can be arranged in hexagonal arrays or curvilinear rows and columns. In general, as used herein, the term scan-line shall refer to any plurality of display elements that share a write-enabling interconnect.

In some implementations the functionality of the controller 134 is divided between a microprocessor and a display controller integrated circuit. In some implementations, the display controller integrated circuit is implemented in an integrated circuit logic device, such as an application specific integrated circuit (ASIC). In some implementations, the microprocessor is configured to carry out all or substantially all of the image processing functionality of the controller 134, as well as determining an appropriate output sequence for the display apparatus 128 to use to generate received images. For example, the microprocessor can be configured to convert image frames included in the received image data into a set of image subframes. Each image subframe is associated with a color and a weight, and includes desired states of each of the display elements in the array 150 of display elements. The microprocessor can also can be configured to determine the number of image subframes to display to produce a given image frame, the order in which the image subframes are to be displayed, and parameters associated with implementing the appropriate weight for each of the image subframes. These parameters may include, in various implementations, the duration for which each of the respective image subframes is to be illuminated and the intensity of such illumination. These parameters (e.g., the number of subframes, the order and timing of their output, and their weight implementation parameters for each subframe) can be collectively referred to as an "output sequence."

In contrast, the display controller integrated circuit can be configured primarily to carry out more routine operations of the display apparatus 128. The operations may include retrieving image subframes from a frame buffer and outputting control signals to the scan drivers 130, the data drivers 132, the common drivers 138, and the lamp drivers 148, in response to the retrieved image subframe and the output sequence determined by the microprocessor. The frame buffer can be any volatile or non-volatile integrated circuit memory, such as dynamic random access memory (DRAM), high-speed cache memory, or flash memory. In some other implementations, the display controller integrated circuit causes the frame buffer to output data signals directly to the various drivers 130, 132, 138, and 148.

In some other implementations, the functionality of the microprocessor and the display controller integrated circuit described above are combined into a single logic device such as the controller 134, which may take the form of a microprocessor, an ASIC, a field programmable gate array (FPGA) or other programmable logic device. In some other implementations, the functionality of the microprocessor and the display controller integrated circuit may be divided in other ways between multiple logic devices, including one or more microprocessors, ASICs, FPGAs, digital signal processors (DSPs) or other logic devices.

The host processor 122 generally controls the operations of the host. For example, the host processor 122 may be a general or special purpose processor for controlling a portable electronic device. With respect to the display apparatus 128, included within the host device 120, the host processor 122 outputs image data as well as additional data about the host. Such information may include data from environmental sensors, such as ambient light or temperature; information about the host, including, for example, an operating mode of the host or the amount of power remaining in the host's power source; information about the content of the image data; information about the type of image data; and/or instructions for display apparatus for use in selecting an imaging mode.

The user input module 126 conveys the personal preferences of the user to the controller 134, either directly, or via the host processor 122. In some implementations, the user input module 126 is controlled by software in which the user programs personal preferences such as "deeper color," "better contrast," "lower power," "increased brightness," "sports," "live action," or "animation." In some other implementations, these preferences are input to the host using hardware, such as a switch or dial. The plurality of data inputs to the controller 134 direct the controller to provide data to the various drivers 130, 132, 138 and 148 which correspond to optimal imaging characteristics.

An environmental sensor module 124 also can be included as part of the host device 120. The environmental sensor module 124 receives data about the ambient environment, such as temperature and or ambient lighting conditions. The sensor module 124 can be programmed to distinguish whether the device is operating in an indoor or office environment versus an outdoor environment in bright daylight versus an outdoor environment at nighttime. The sensor module 124 communicates this information to the display controller 134, so that the controller 134 can optimize the viewing conditions in response to the ambient environment.

Figure 2:
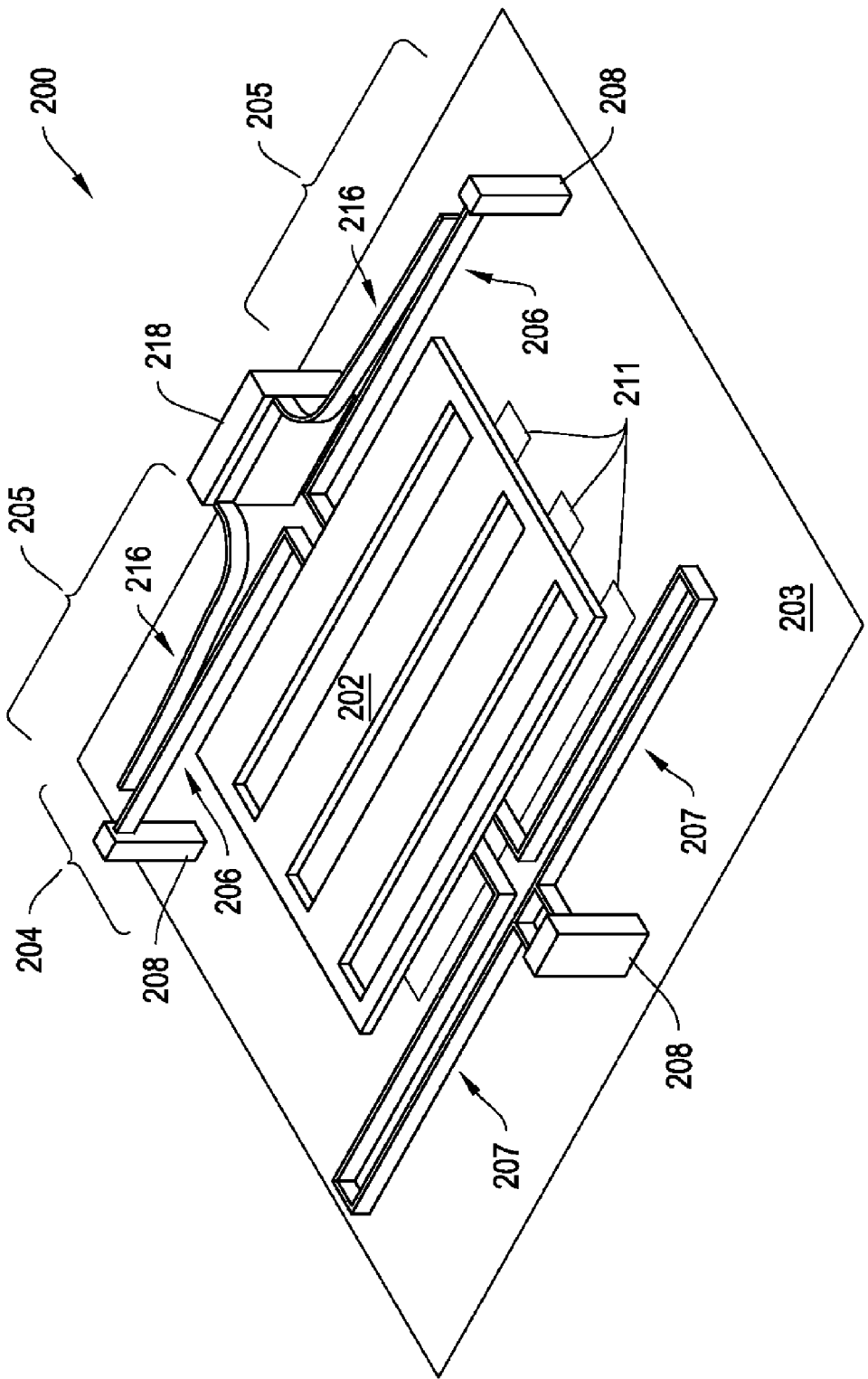
FIG. 2 shows a perspective view of an example shutter-based light modulator.

FIG. 2 shows a perspective view of an example shutter-based light modulator 200. The shutter-based light modulator 200 is suitable for incorporation into the direct-view MEMS-based display apparatus 100 of FIG. 1A. The light modulator 200 includes a shutter 202 coupled to an actuator 204. The actuator 204 can be formed from two separate compliant beam electrode actuators 205 (the "actuators 205"). The shutter 202 couples on one side to the actuators 205. The actuators 205 move the shutter 202 transversely over a surface 203 in a plane of motion which is substantially parallel to the surface 203. The opposite side of the shutter 202 couples to a spring 207 which provides a restoring force opposing the forces exerted by the actuator 204.

Each actuator 205 includes a compliant load beam 206 connecting the shutter 202 to a load anchor 208. The load anchors 208 along with the compliant load beams 206 serve as mechanical supports, keeping the shutter 202 suspended proximate to the surface 203. The surface 203 includes one or more aperture holes 211 for admitting the passage of light. The load anchors 208 physically connect the compliant load beams 206 and the shutter 202 to the surface 203 and electrically connect the load beams 206 to a bias voltage, in some instances, ground.

If the substrate is opaque, such as silicon, then aperture holes 211 are formed in the substrate by etching an array of holes through the substrate. If the substrate is transparent, such as glass or plastic, then the aperture holes 211 are formed in a layer of light-blocking material deposited on the substrate. The aperture holes 211 can be generally circular, elliptical, polygonal, serpentine, or irregular in shape.

Each actuator 205 also includes a compliant drive beam 216 positioned adjacent to each load beam 206. The drive beams 216 couple at one end to a drive beam anchor 218 shared between the drive beams 216. The other end of each drive beam 216 is free to move. Each drive beam 216 is curved such that it is closest to the load beam 206 near the free end of the drive beam 216 and the anchored end of the load beam 206.

In operation, a display apparatus incorporating the light modulator 200 applies an electric potential to the drive beams 216 via the drive beam anchor 218. A second electric potential may be applied to the load beams 206. The resulting potential difference between the drive beams 216 and the load beams 206 pulls the free ends of the drive beams 216 towards the anchored ends of the load beams 206, and pulls the shutter ends of the load beams 206 toward the anchored ends of the drive beams 216, thereby driving the shutter 202 transversely toward the drive anchor 218. The compliant members 206 act as springs, such that when the voltage across the beams 206 and 216 potential is removed, the load beams 206 push the shutter 202 back into its initial position, releasing the stress stored in the load beams 206.

A light modulator, such as the light modulator 200, incorporates a passive restoring force, such as a spring, for returning a shutter to its rest position after voltages have been removed. Other shutter assemblies can incorporate a dual set of "open" and "closed" actuators and separate sets of "open" and "closed" electrodes for moving the shutter into either an open or a closed state.

FIGS. 3A-3D show isometric views of stages of construction of an example shutter assembly 300 with narrow sidewall beams. This process yields compliant actuator beams 318 and 320 and a compliant spring beam 316 (collectively referred to as "sidewall beams 316, 318 and 320"), which have a width well below the conventional lithography limits on large glass panels. In the process depicted in FIGS. 3A-3D, the compliant beams of shutter assembly 300 are formed as sidewall features on a mold made from a sacrificial material. The process is referred to as a sidewall beams process.

The process of forming the shutter assembly 300 with the sidewall beams 316, 318 and 320 begins, as depicted in FIG. 3A, with the deposition and patterning of a first sacrificial material 301. The pattern defined in the first sacrificial material 301 creates openings or vias 302 within which anchors for the shutter assembly 300 eventually will be formed.

Figure 3B:
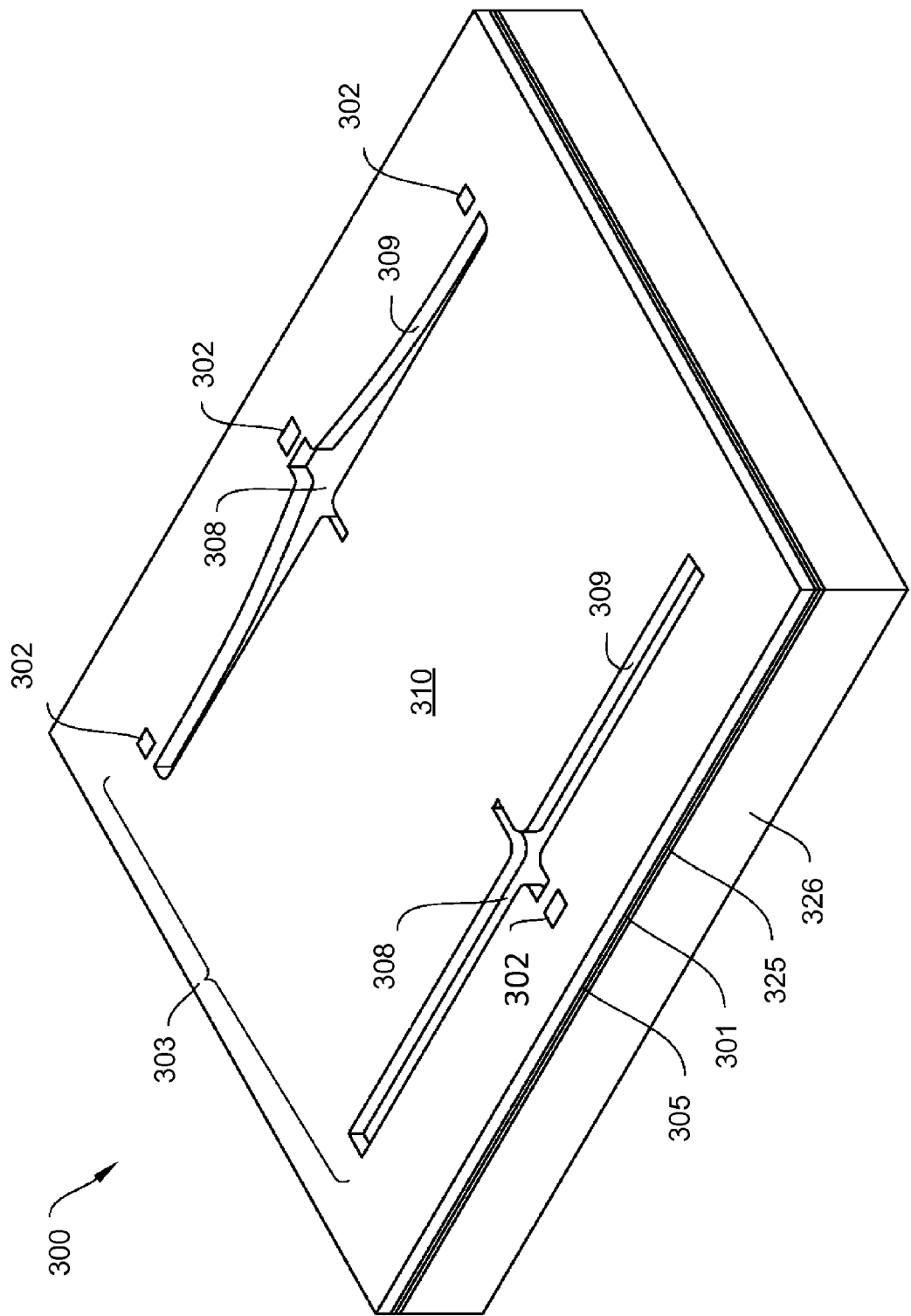

The process of forming the sidewall beams 316, 318 and 320 continues with the deposition and patterning of a second sacrificial material 305. FIG. 3B shows the shape of a mold 303 that is created after patterning of the second sacrificial material 305. The mold 303 also includes the first sacrificial material 301 with its previously defined vias 302. The mold 303 in FIG. 3B includes two distinct horizontal levels. The bottom horizontal level 308 of the mold 303 is established by the top surface of the first sacrificial layer 301 and is accessible in those areas where the second sacrificial material 305 has been etched away. The top horizontal level 310 of the mold 303 is established by the top surface of the second sacrificial material 305. The mold 303 depicted in FIG. 3B also includes substantially vertical sidewalls 309.

Materials for use as the first and second sacrificial materials 301 and 305 include polyimide. Other candidate sacrificial layer materials include, without limitation, polymer materials such as polyamide, fluoropolymer, benzocyclobutene, polyphenylquinoxylene, parylene, or polynorbornene. These materials are chosen for their ability to planarize rough surfaces, maintain mechanical integrity at processing temperatures in excess of 250° C., and their ease of etch and/or thermal decomposition during removal. In other implementations, the sacrificial layer 301 and/or 305 is formed from a photoresist, such as polyvinyl acetate, polyvinyl ethylene, and phenolic or novolac resins. An alternate sacrificial layer material used in some implementations is $SiO_2$, which can be removed preferentially as long as other electronic or structural layers are resistant to the hydrofluoric acid solutions used for its removal. One such suitable resistant material is $Si_3N_4$. Another alternate sacrificial layer material is Si, which can be removed preferentially as long as electronic or structural layers are resistant to the fluorine plasmas or xenon difluoride ($XeF_2$) used for its removal, such as most metals and $Si_3N_4$. Yet another alternate sacrificial layer material is Al, which can be removed preferentially as long as other electronic or structural layers are resistant to strong base solutions, such as concentrated sodium hydroxide (NaOH) solutions. Suitable materials include, for example, Cr, Ni, Mo, Ta and Si. Still another alternate sacrificial layer material is Cu, which can be removed preferentially as long as other electronic or structural layers are resistant to nitric or sulfuric acid solutions. Such materials include, for example, Cr, Ni, and Si.

Figure 3C:
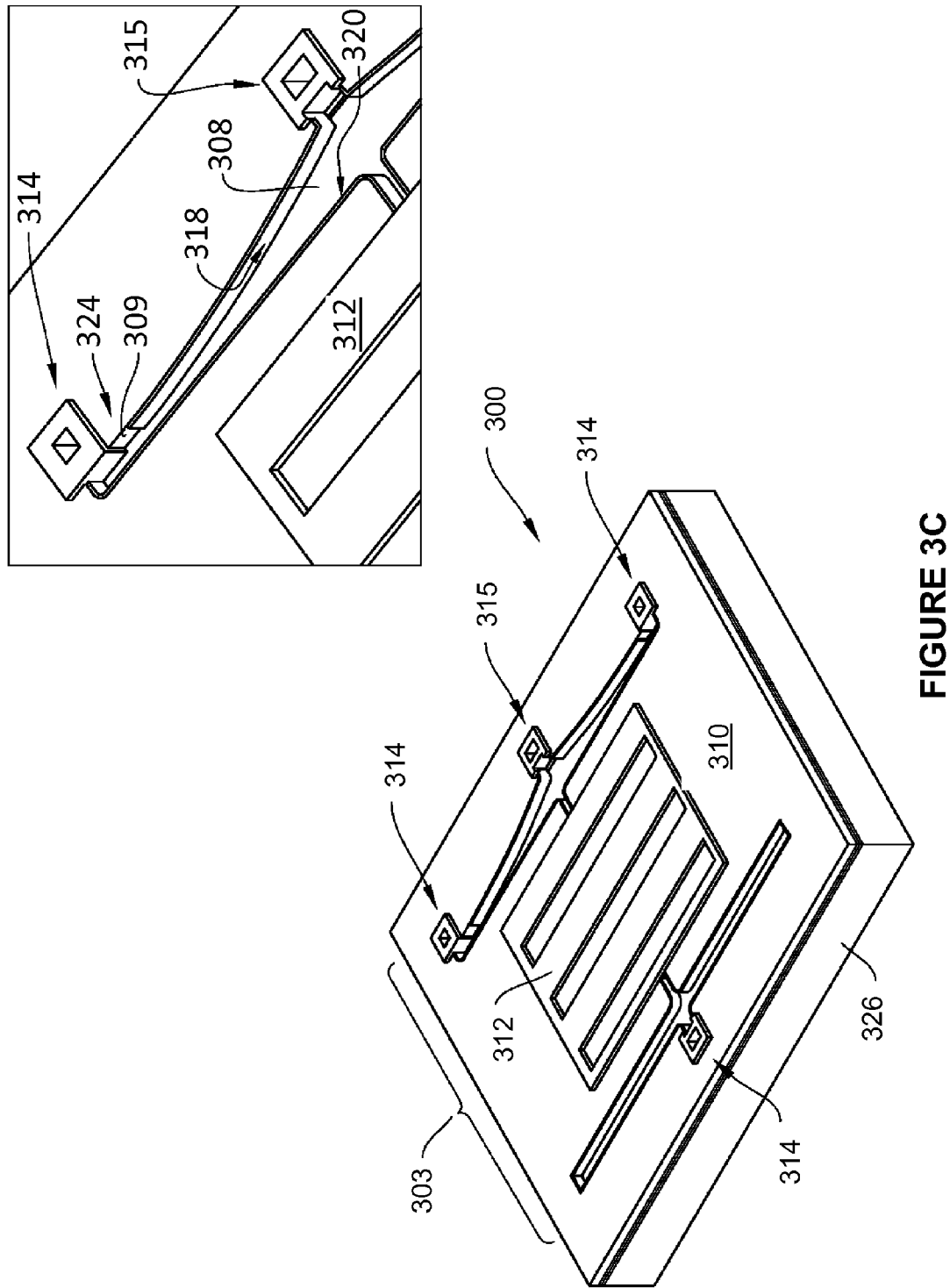

The process of forming the sidewall beams 316, 318 and 320 continues with the deposition and patterning of shutter material onto all of the exposed surfaces of the sacrificial mold 303, as depicted in FIG. 3C. The elements of the composite shutter 312 include a first mechanical layer, a conductor layer, a second mechanical layer and/or a dielectric. At least one of the mechanical layers can be deposited to thicknesses in excess of 0.15 microns, as one or both of the mechanical layers serves as the principal load bearing and mechanical actuation member for the shutter assembly, though in some implementations, the mechanical layers may be thinner. Candidate materials for the mechanical layers include, without limitation, metals such as aluminum (Al), copper (Cu), nickel (Ni), chromium (Cr), molybdenum (Mo), titanium (Ti), tantalum (Ta), niobium (Nb), neodymium (Nd), or alloys thereof; dielectric materials such as aluminum oxide ($Al_2O_3$), silicon oxide ($SiO_2$), tantalum pentoxide ($Ta_2O_5$), or silicon nitride ($Si_3N_4$); or semiconducting materials such as diamond-like carbon, silicon (Si), germanium (Ge), gallium arsenide (GaAs), cadmium telluride (CdTe) or alloys thereof. At least one of the layers, such as the conductor layer, should be electrically conducting so as to carry charge on to and off of the actuation elements. Candidate materials include, without limitation, Al, Cu, Ni, Cr, Mo, Ti, Ta, Nb, Nd, or alloys thereof or semiconducting materials such as diamond-like carbon, Si, Ge, GaAs, CdTe or alloys thereof. In some implementations employing semiconductor layers, the semiconductors are doped with impurities such as phosphorus (P), arsenic (As), boron (B), or Al.

In some implementations, the order of the layers in the composite shutter assembly 300 can be inverted, such that the outside of the shutter assembly 300 is formed from a conductor layer while the inside of the shutter assembly 300 is formed from a mechanical layer. In some implementations, the shutter assembly includes only one conductor layer and one mechanical layer.

The shutter material is deposited to a thickness of less than about 2 microns. In some implementations, the shutter material is deposited to have a thickness of less than about 1.5 microns. In some other implementations, the shutter material is deposited to have a thickness of less than about 1.0 microns, and as thin as about 0.10 microns. After deposition, the shutter material (which may be a composite of several materials as described above) is patterned. First, a photoresist is deposited on the shutter material. The photoresist is then patterned. The pattern developed into the photoresist is designed such that the shutter material, after a subsequent etch stage, remains in the region of the shutter 312 as well as at the anchors 314.

The manufacturing process continues with applying an anisotropic etch, resulting in the structure depicted in FIG. 3C. The anisotropic etch of the shutter material is carried out in a plasma atmosphere with a voltage bias applied to the substrate 326 or to an electrode in proximity to the substrate 326. The biased substrate 326 (with electric field perpendicular to the surface of the substrate 326) leads to acceleration of ions toward the substrate 326 at an angle nearly perpendicular to the substrate 326. Such accelerated ions, coupled with the etching chemicals, lead to etch rates that are much faster in a direction that is normal to the plane of the substrate 326 as compared to directions parallel to the substrate 326. Undercut-etching of shutter material in the regions protected by a photoresist is thereby substantially eliminated. Along the vertical sidewalls 309 of the mold 303, which are substantially parallel to the track of the accelerated ions, the shutter material also is substantially protected from the anisotropic etch. Such protected sidewall shutter material forms the sidewall beams 316, 318, and 320 for supporting the shutter 312. Along other (non-photoresist-protected) horizontal surfaces of the mold 303, such as the top horizontal surface 310 or the bottom horizontal surface 308, the shutter material has been substantially completely removed by the etch.

Figure 3D:
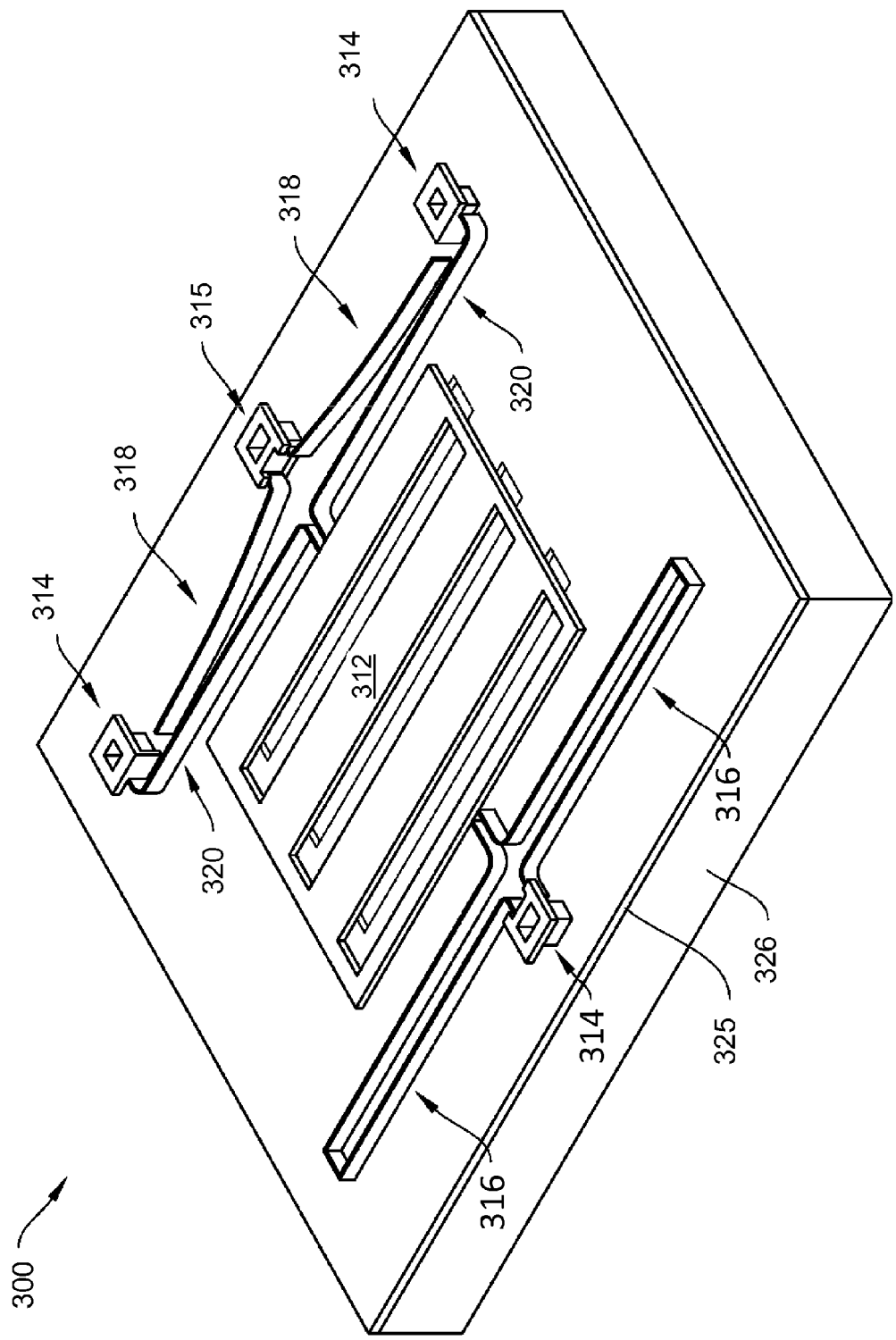

The process of forming the sidewall beams 316, 318 and 320 is completed with the removal of the remainder of the second sacrificial material 305 and the first sacrificial material 301. The result is shown in FIG. 3D. The sacrificial layer is removed, which frees-up all moving parts from the substrate, except at the anchor points 314. In some implementations, polyimide sacrificial materials are removed in an oxygen plasma. Other polymer materials used for the sacrificial layer also can be removed in an oxygen plasma, or in some cases by thermal pyrolysis. Some sacrificial layer materials (such as $SiO_2$) can be removed by wet chemical etching or by vapor phase etching.

The material deposited on the vertical sidewalls 309 of the mold 303 remain as the sidewall beams 316, 318 and 320. The sidewall beam 316 serves as a spring mechanically connecting the anchors 314 to the shutter 312, and also provides a passive restoring force and to counter the forces applied by the actuator formed from the compliant beams 318 and 320. The anchors 314 connect to an aperture layer 325. The sidewall beams 316, 318 and 320 are tall and narrow. The width of the sidewall beams 316, 318 and 320, as formed from the surface of the mold 303, is similar to the thickness of the shutter material as deposited. In some implementations, the width of sidewall beam 316 will be the same as the thickness of shutter 312. In some other implementations, the beam width will be about ½ the thickness of the shutter 312. The height of the sidewall beams 316, 318 and 320 is determined by the thickness of the second sacrificial material 305, or in other words, by the depth of the mold 303, as created during the patterning operation described in relation to FIG. 3B. As long as the thickness of the deposited shutter material is chosen to be less than about 2 microns, the process depicted in FIGS. 3A-3D is well suited for the production of narrow beams. In fact, for many applications a thickness range of 0.1 to 2.0 microns is quite suitable. Conventional photolithography would limit the patterned features shown in FIGS. 3A, 3B and 3C to much larger dimensions, for instance allowing minimum resolved features no smaller than 2 microns or 5 microns.

FIG. 3D depicts an isometric view of the shutter assembly 300, formed after the release operation in the above-described process, yielding compliant beams with cross sections of high aspect ratios. As long as the thickness of the second sacrificial material 305 is, for example, greater than about 4 times larger than the thickness of the shutter material, the resulting ratio of beam height to beam width will be produced to a similar ratio, i.e., greater than about 4:1.

An optional stage, not illustrated above but included as part of the process leading to FIG. 3C, involves isotropic etching of the sidewall beam material to separate or decouple the compliant load beams 320 from the compliant drive beams 318. For instance, the shutter material at point 324 has been removed from the sidewall through use of an isotropic etch. An isotropic etch is one whose etch rate is substantially the same in all directions, so that sidewall material in regions such as point 324 is no longer protected. The isotropic etch can be accomplished in the typical plasma etch equipment as long as a bias voltage is not applied to the substrate 326. An isotropic etch also can be achieved using wet chemical or vapor phase etching techniques. Prior to this optional fourth masking and etch stage, the sidewall beam material exists essentially continuously around the perimeter of the recessed features in the mold 303. The fourth mask and etch stage is used to separate and divide the sidewall material, forming the distinct beams 318 and 320. The separation of the beams 318 and 320 at point 324 is achieved through a fourth process of photoresist dispense, and exposure through a mask. The photoresist pattern in this case is designed to protect the sidewall beam material against isotropic etching at all points except at the separation point 324.

As a final stage in the sidewall process, an encapsulating dielectric is deposited around the outside surfaces of the sidewall beams 316, 318 and 320.

Figure 4A:
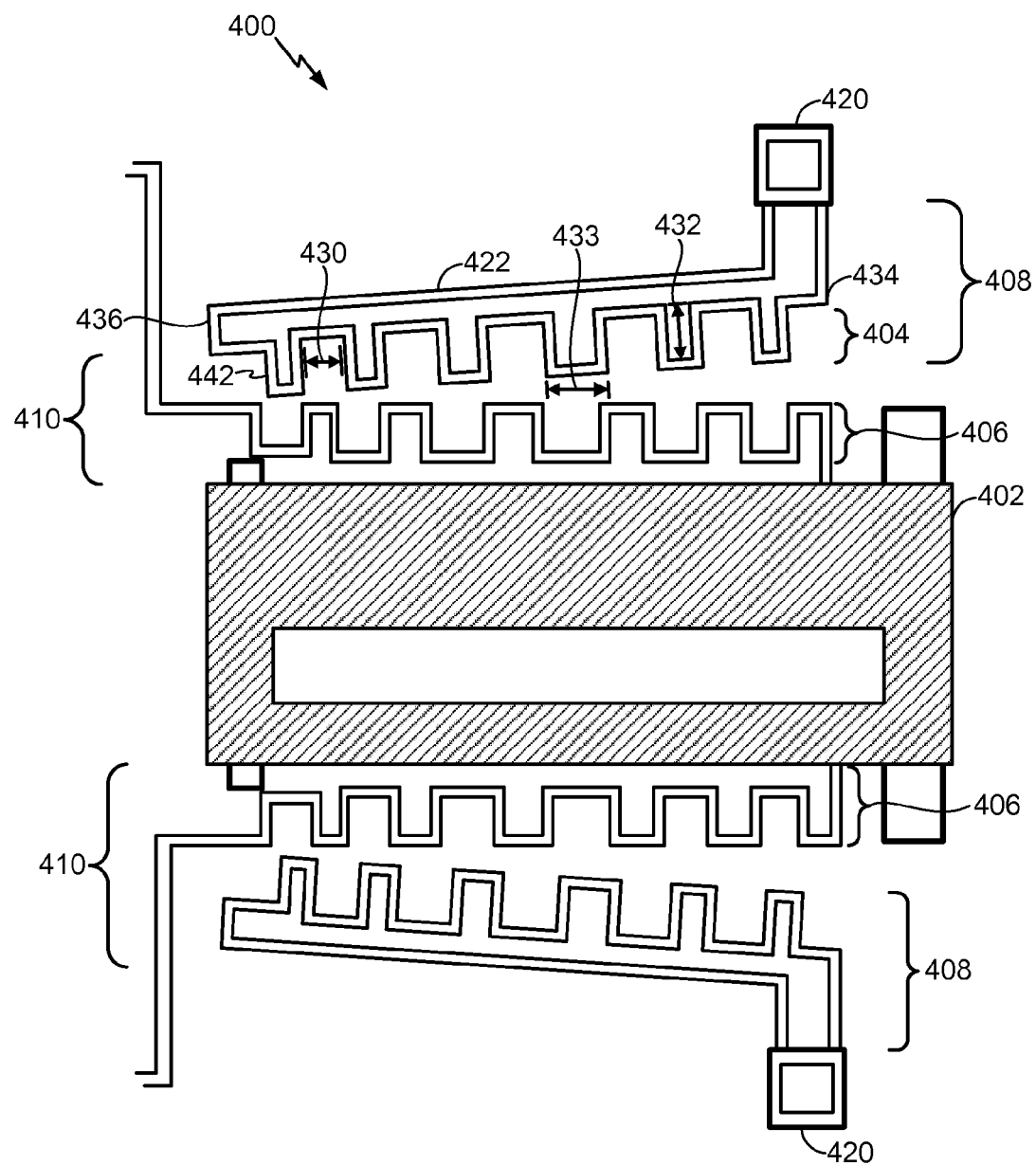
FIGS. 4A and 4B show top-down views of example electrostatically actuated light modulators.
Figure 4B:
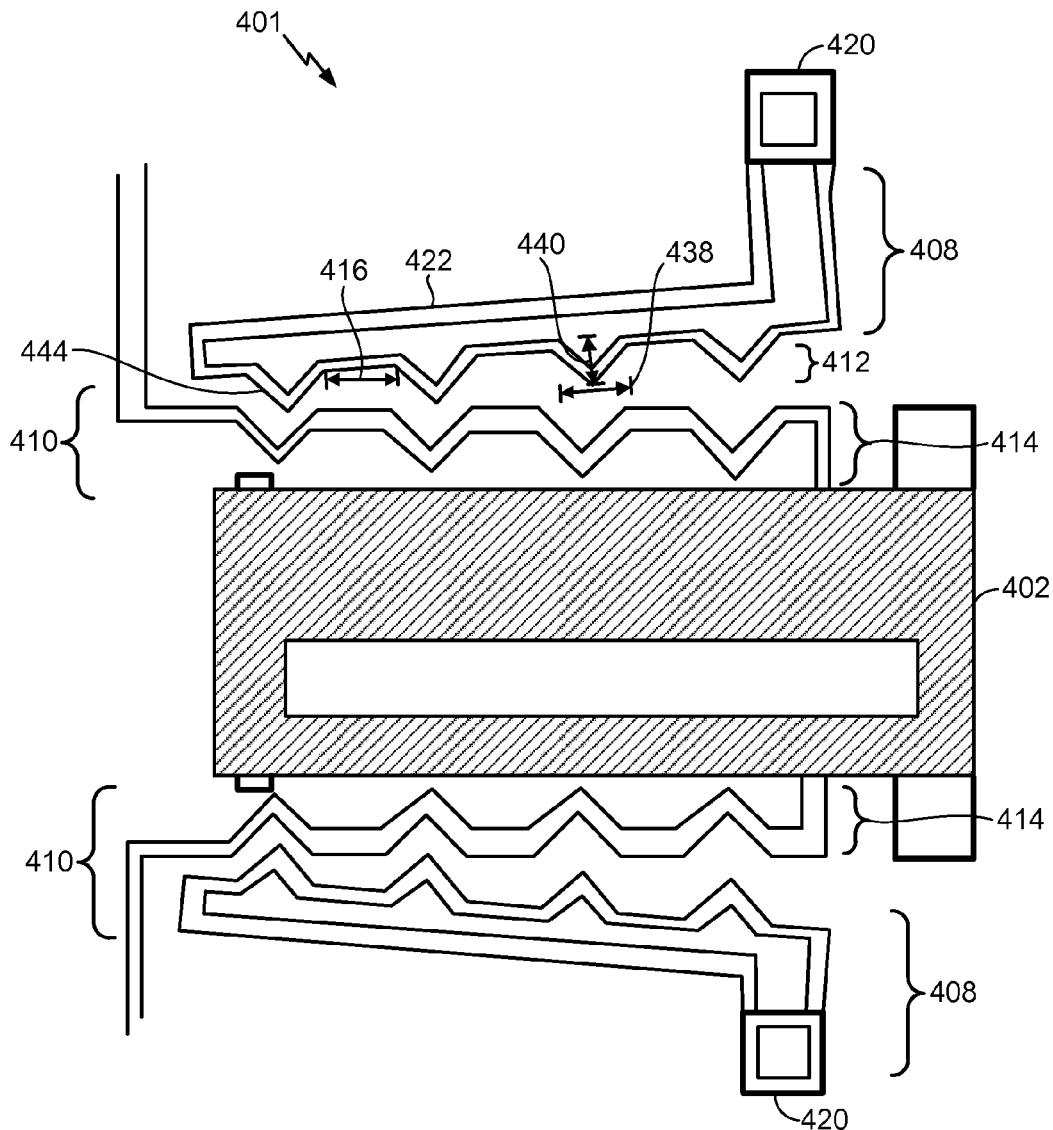

FIGS. 4A and 4B show top-down views of example electrostatically actuated light modulators 400 and 401. The light modulator 400 includes a shutter 402, at least one compliant drive beam 408 (e.g., compliant beam electrode) and at least one compliant load beam 410 (e.g., compliant beam electrode). The drive beam 408 is coupled to a drive anchor 420 to provide support for the drive beam 408 over a substrate. The drive beam 408 and load beam 410 include elongated portions that include respective sets of corrugations 404 and 406. The sets of corrugations 404 and 406 are complementary in that when the beams 408 and 410 are drawn together in response to a voltage being applied across the beams 408 and 410, the corrugations in the opposing sets of corrugations 404 and 406 engage one another, or substantially fit together. This allows the drive beam 408 and load beam 410 to come together along the majority of their lengths. In some implementations, the sets of corrugations 404 and 406 can be added to the shutter-based light modulator 200 shown in FIG. 2.

In operation, when a voltage is applied across the load beam 410 and drive beam 408, the electric field between directly opposing surfaces creates an electromotive force, pulling the surfaces together. In addition, fringing fields between misaligned portions of the beams (i.e., the spaced apart sides of opposing corrugations 404 and 406) create a separate electromotive force that attempts to bring such surfaces into an aligned state of lower energy. This force provides additional attractive force between the load beam 410 and drive beam 408. This additional force can result in faster actuation. Alternatively, knowing that additional force can be generated at a given applied voltage, the actuator can instead be actuated at the same speed at a lower voltage, thus saving power.

A series of protrusions 442 (also referred to as "teeth") form the set of corrugations 404 and 406. The protrusions of the set of corrugations 404 and 406 are separated from one another along the length of the drive beam 408 or load beam 410 by a separation distance 430. In some implementations, the separation distance 430 is at least about 3 microns. In some implementations, the separation distance 430 can range from between about 4 and about 20 microns. In some implementations, each of the protrusions 442 in a given set of corrugations 404 or 406 can be of the same size. In some other implementations, the dimensions of the protrusions 442 in a given set of corrugations 404 or 406 can be different. In addition, the separation distance 430 of the protrusions 442 in a given set of corrugations 404 or 406 can remain equal in some implementations, or change in some other implementations, for example, from one end of the drive beam 408 or load beam 410 to the other end of the drive beam 408 or load beam 410.

Each protrusion or tooth 442 of the set of corrugations 404 and 406 has a width 433 and depth 432. The width 433 of a protrusion can be selected to be relative to the depth 432 of the protrusion 442. In some implementations, the width 433 is greater than the depth 432. In some implementations, the ratio of the width 433 to depth 432 can range from about 2:1 to about 5:1. In some implementations, the width 433 of the protrusion 442 can be set based on the desired length of the drive beam 408 and the load beam 410 and the number of desired protrusions 442. In some examples, the width 433 and depth 432 can be about 10×3 microns; about 6×2 microns; or about 8×4 microns. The number of protrusions 442 can be at least two, and range from two to eight or more.

The load beam 410 is coupled to the shutter 402, and has a first primary elongated portion including the set of corrugations 406 along the length of the load beam 410. In some implementations, the shutter 402 couples to the top of the load beam 410 (see, e.g., FIG. 5A where shutter 504 rests on load beam 508). The load beam 410 is designed and constructed to be compliant or flexible.

In some implementations, the sets of corrugations 404 and 406 only trace the perimeter contours of a set of parallel ridges or grooves formed by the beams 408 and 410. Or put another way, the beams 408 and 410 trace the contours of respective sets of corrugations 404 and 406. By merely tracing the contours of the sets of corrugations 404 and 406, instead of forming solid corrugations or teeth, the beams 408 and 410 have increased flexibility. This increased flexibility of the beams 408 and 410, particularly when arranged in the zipper-like fashion described above, can significantly reduce the voltage needed to draw the beams together.

In some implementations, the drive beam 408 includes a rear elongated portion 422 extending back from the distal end of the drive beam 408 behind the elongated portion of the drive beam that is adjacent to the load beam 410. In some implementations, the rear elongated portion couples to the distal end of the drive beam 408 back to the anchor 420, forming a loop. In some implementations, the beam 408 does not include elongated portion 422, i.e., the beam 408 may not form a loop. Rather, a single elongated portion including the corrugations 404 may be coupled to, and extend away from, the anchor 420 without looping back to the anchor 420.

In some implementations, an elongated portion of the drive beam 408 can be at an angle with respect to an elongated portion of the load beam 410. For example, in an unactuated state, a proximal end 434 of the drive beam 408 proximate to the anchor 420 can be further away from the load beam 410 than an opposite, distal end 436 of the drive beam 408 (i.e., the distal end 436 is closer to load beam 410). When an actuation voltage is applied to the drive beam 408, there will be a greater electromotive force between the distal end 436 of the drive beam 408 and load beam 410 as compared to the proximal end 434 of the drive beam 408 and the load beam 410. Thus, the distal end 436 of the drive beam 408 will draw the load beam 410 and shutter 402 together at a lower voltage as compared to the proximal end 434. As the beams 408 and 410 are drawn together progressively in a "zipper" like fashion, the beams 408 and 410 can be drawn at a lower actuation voltage than required to draw together substantially parallel beams separated by a distance equal to the distance between the proximal end 434 of the drive beam 408 and the nearest point on the load beam 410 to the proximal end 434 of the drive beam 408.

FIG. 4B shows another example of an electrostatically actuated light modulator 401. The light modulator 401 is substantially the same as light modulator 400 shown in FIG. 4A. However, the light modulator 401 shown in FIG. 4B includes beam electrodes 408 and 410 having saw tooth or triangular corrugations 412 and 414, instead of rectangular corrugations 404 and 406. The saw tooth or triangular corrugations increase the surface area of the beam electrodes 408 and 410, which can increase the magnitude of an electric field. Triangular corrugations 412 and 414 can be advantageous because opposing corrugations need not be aligned to as great a tolerance while still providing reliable operation.

The set of corrugations 412 and 414 can include a series of protrusions or teeth 444 separated by a separation distance 416. In some implementations, the separation distance 416 can be consistent between protrusions 444 and range from about 4 to about 20 microns, or vary from one end of the drive beam 408 or load beam 410 to the other end of the drive beam 408 or load beam 410. Each protrusion 444 can have a width 438 and depth 440. In some implementations, the width 438 can be selected to be relative to the depth 440. In some implementations, the ratio of width 438 to depth 440 can be similar to that of rectangular corrugations described in FIG. 4A. In some implementations, the width 438 and depth 440 can be selected based on a desired perimeter or area of the protrusion 444. In some implementations, width 438 and depth 440 can vary based on the number of desired protrusions 444 for a set of corrugations 412 or 414, or a length of beam drive 408 or load beam 410. The triangular protrusions 444 can be defined by various geometrical attributes. For example, the protrusion 444 can be defined based on an apex angle of the triangle and/or type of triangle (e.g., right triangle, equilateral, isosceles, oblique, obtuse, acute, etc.). In some implementations, the apex angle of the protrusion 444 ranges from about 45 degrees to 135 degrees, while in other implementations, the apex angle of the protrusions range from 10 degrees to 170 degrees. The apex angle can vary or be selected based on the desired separation distance 416, width 438, depth 440 and/or number of protrusions. In other implementations, the corrugations can be U-shaped, or another shape that facilitates actuation of a shutter 402.

Figure 5A:
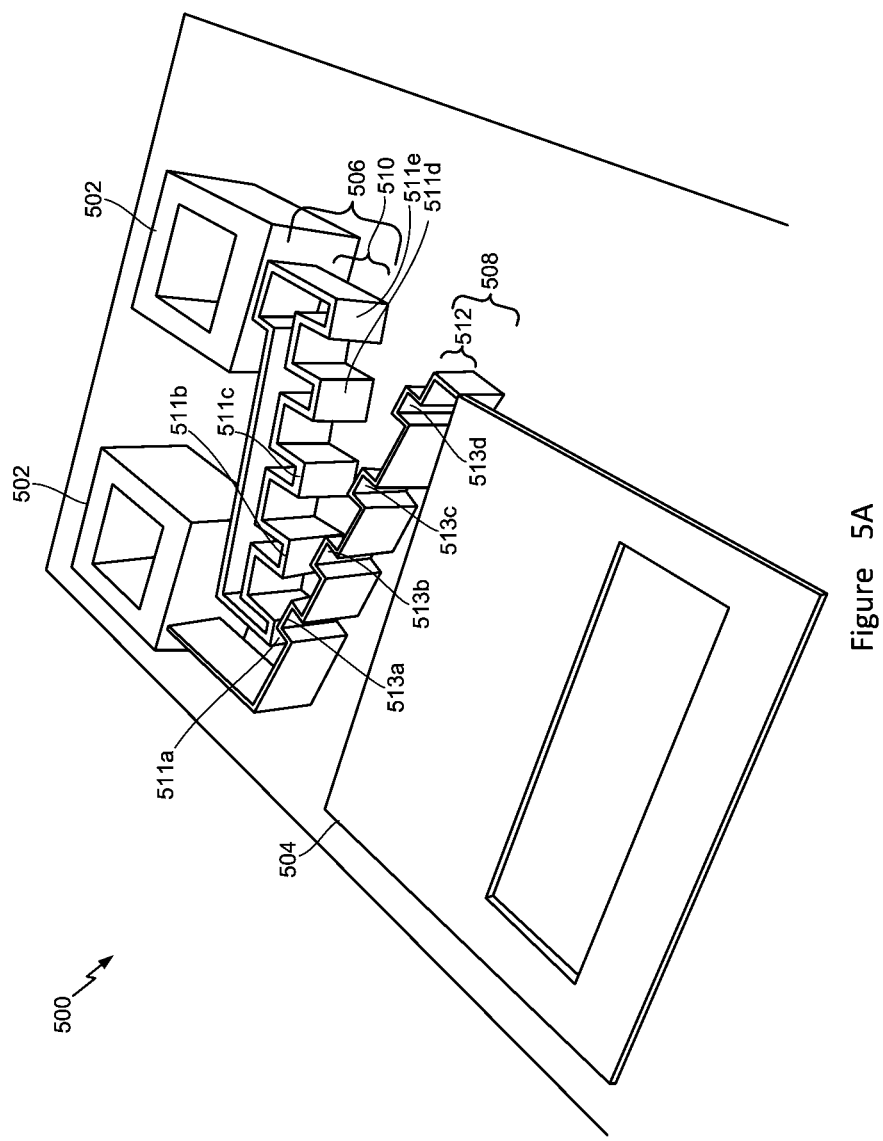
FIGS. 5A and 5B show perspective views of additional example electrostatically actuated light modulators.
Figure 5B:
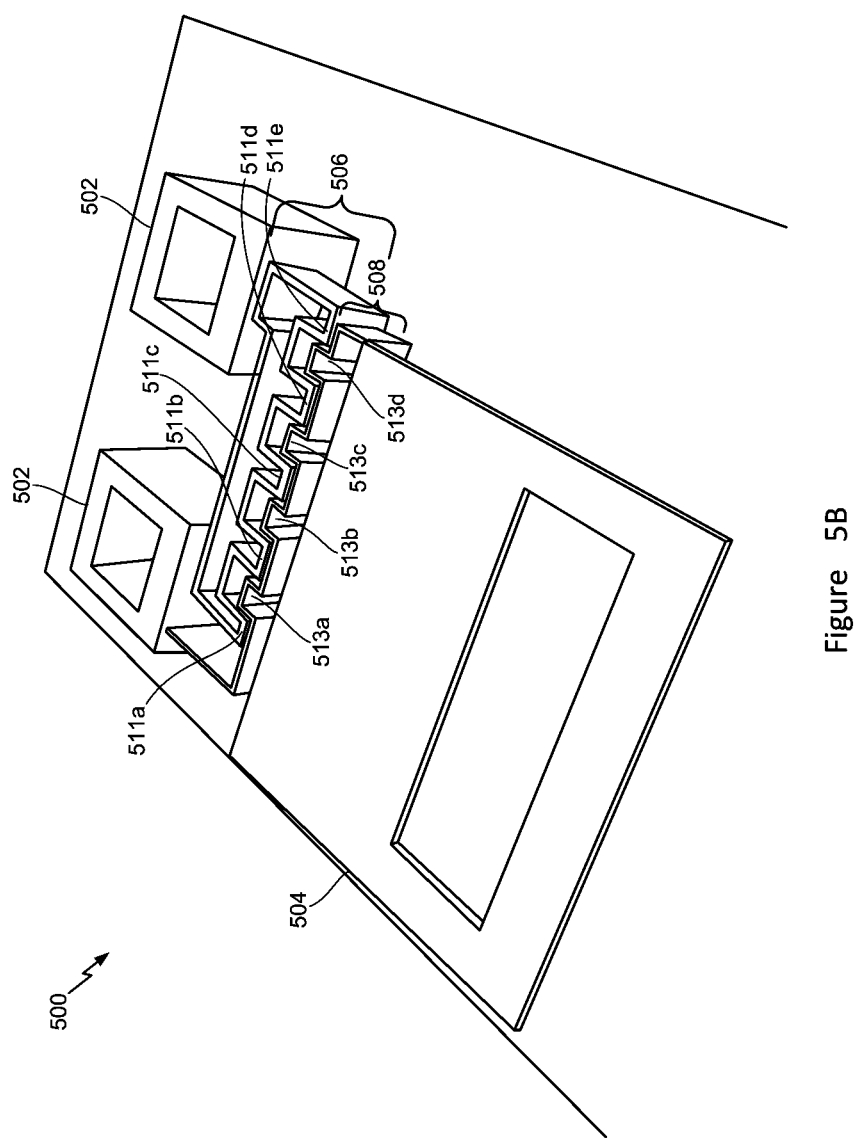

FIGS. 5A and 5B show perspective views of example electrostatically actuated light modulators 500 and 501. The electrostatically actuated light modulator 500 includes a shutter 504, or other light obstructing component. A load beam 508 (e.g., a beam electrode), which is coupled to the shutter 504, includes a set of corrugations 512 formed by a series of protrusions or teeth 513a-513d. In this example, the drive beam 506 (e.g., a beam electrode) forms a loop that includes two substantially parallel elongated portions. The light modulator 500 also includes a drive beam 506, which is coupled to anchor 502. The drive beam 506 includes a complementary set of corrugations 510 formed by a series of protrusions or teeth 511a-511d. The actuation state shown in FIG. 5A corresponds to an "unactuated" state, as the corrugations 512 and 510 are not drawn together nor are they engaged.

In some implementations, in an unactuated state, a length of the drive beam 506 can form an angle with respect to an opposing length of the load beam 508. That is, a first protrusion, such as protrusion 511a of the drive beam 506, can, in an unactuated state, be closer to the load beam 508 than a second protrusion, such as protrusion 511e of the drive beam 506. Configuring the drive beam 506 such that it forms an angle greater than 0 degrees and less than 90 degrees with respect to the load beam 508 can result in a lower required actuation voltage by causing a "zipper" effect, as described above.

Upon actuating the light modulator with an actuation voltage, the corrugations 511a-511d and 513a-513d will be drawn together and substantially engage one another, as shown in the example "actuated" light modulator 501 of FIG. 5B. In this illustrative example, the opposing corrugations 511a-511d and 513a-513d were drawn together by the electromotive force acting between the drive beam 506 and load beam 508.

Figure 6:
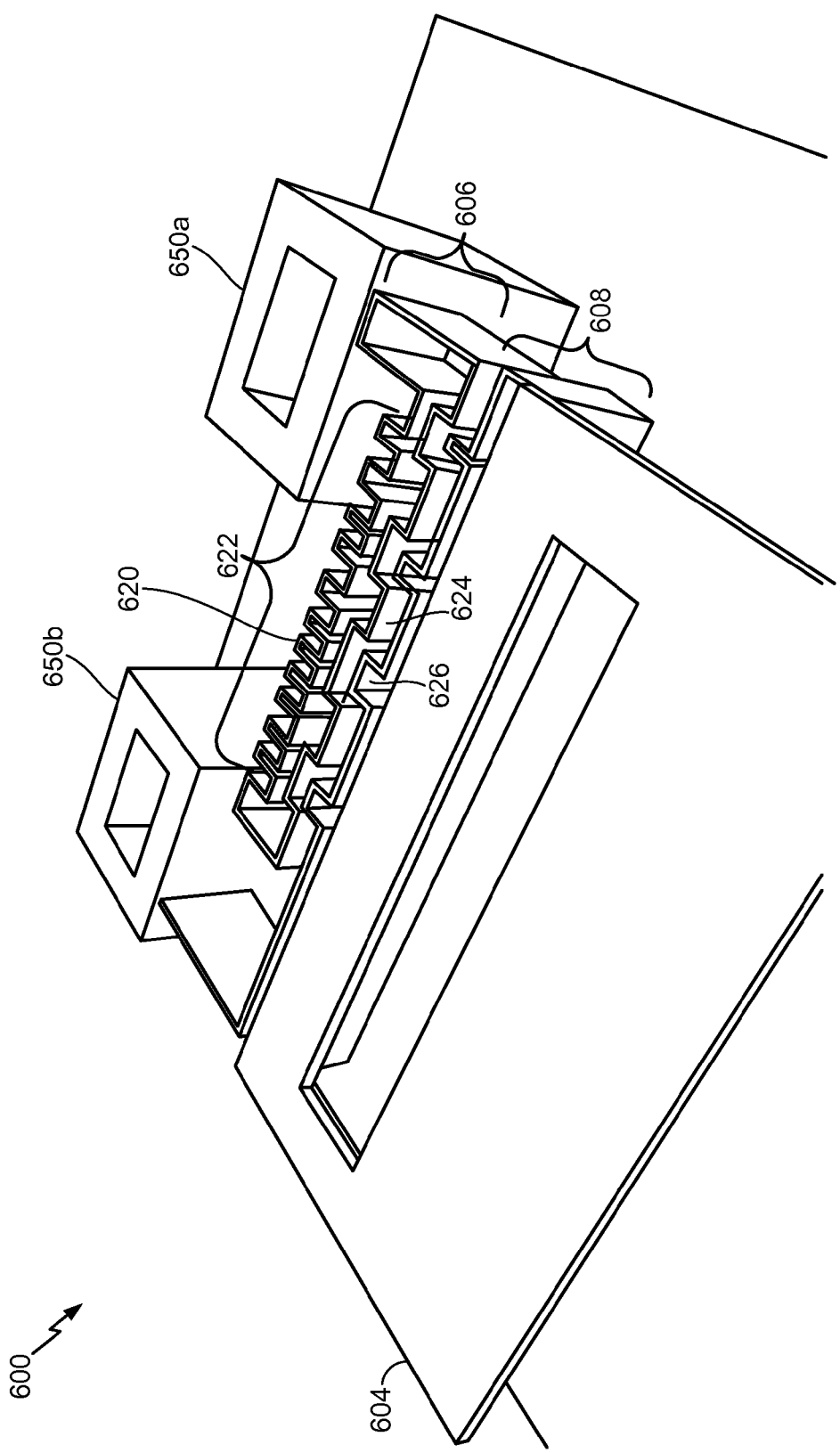
FIG. 6 shows a perspective view of an additional example of an electrostatically actuated light modulators.

FIG. 6 shows a perspective view of an example electrostatically actuated light modulator 600 that includes a drive beam 606 (e.g., a beam electrode) incorporating a front set of corrugations 624 and a rear set of corrugations 622. The front set of corrugations 624 are formed along a first elongated portion of the drive beam 606 positioned adjacent the load beam 608 (e.g., beam electrode). The rear set of corrugations 622 are formed along a second elongated portion of the drive beam 606 coupling the distal end of the first elongated portion back to the anchor 650a. While the rear set of corrugations 622 are not drawn together to substantially engage a complementary set of corrugations, they are nevertheless advantageous. In some implementations, incorporating the rear set of corrugations 622 along the second elongated portion can help adjust the rest position of the drive beam 606 (i.e., its position when not actuated) by leveraging stress gradients in the drive beam 606, which can bend the drive beam 606 towards the load beam 608.

By introducing a stress or stress gradient on the second elongated portion (i.e., the portion further from the opposing beam), the drive beam 606 can be made to bend towards the opposing load beam 608. In some implementations, this stress or stress gradient can be introduced by forming the beam such that a thickness of the second elongated portion varies along its length. In some implementations, the variation of the thickness of the second elongated portion of the beam is achieved by forming the second elongated portion on sidewalls of a mold built on a substrate. Some sidewalls of the mold are configured to have an angle with the substrate that is shallower than the angle formed by the remaining sidewalls of the mold. This results in a part of the second portion that is formed on these shallow angled sidewalls to be thinner than the rest of the second portion. Due to this variation in the thickness, the second portion can develop a certain amount of stress or stress gradient. As a result, when the drive beam 606 is released from the mold, this stress or stress gradient causes the drive beam 606 to bend towards the opposing beam.

In some other implementations, the second elongated portion of the drive beam 606 includes one or more generally rectangular, triangular or U-shaped beam regions, protrusions or a set of corrugations. The beam material along the series of protrusions is thinner than the beam material adjacent to these protrusions. In some implementations, the separation distance between the rear protrusions is at or about the patterning limits. For example, the separation distance between the rear protrusions 620 may be about 2 to about 4 microns. This results in a stress or stress gradient that can lead to the expansion of the protruded beam regions. The expansion of the protruded regions results in the bending of the end of drive beam 606 towards the opposing load beam 608.

The rear set of corrugations 622 includes one or more protrusions 620. The number, width, and depth of the protrusions 620 can vary. In some implementations, the set of corrugations 622 include a greater number of protrusions 620 as compared to the set of corrugations 510 (as shown in FIGS. 5A and 5B) on the first elongated portion of the drive beam 606. In some implementations, the protrusions 620 have a smaller width and greater depth as compared to the set of corrugations 510. In some implementations, the corrugations 622 can be triangular, saw toothed, or U-shaped.

Figure 7:
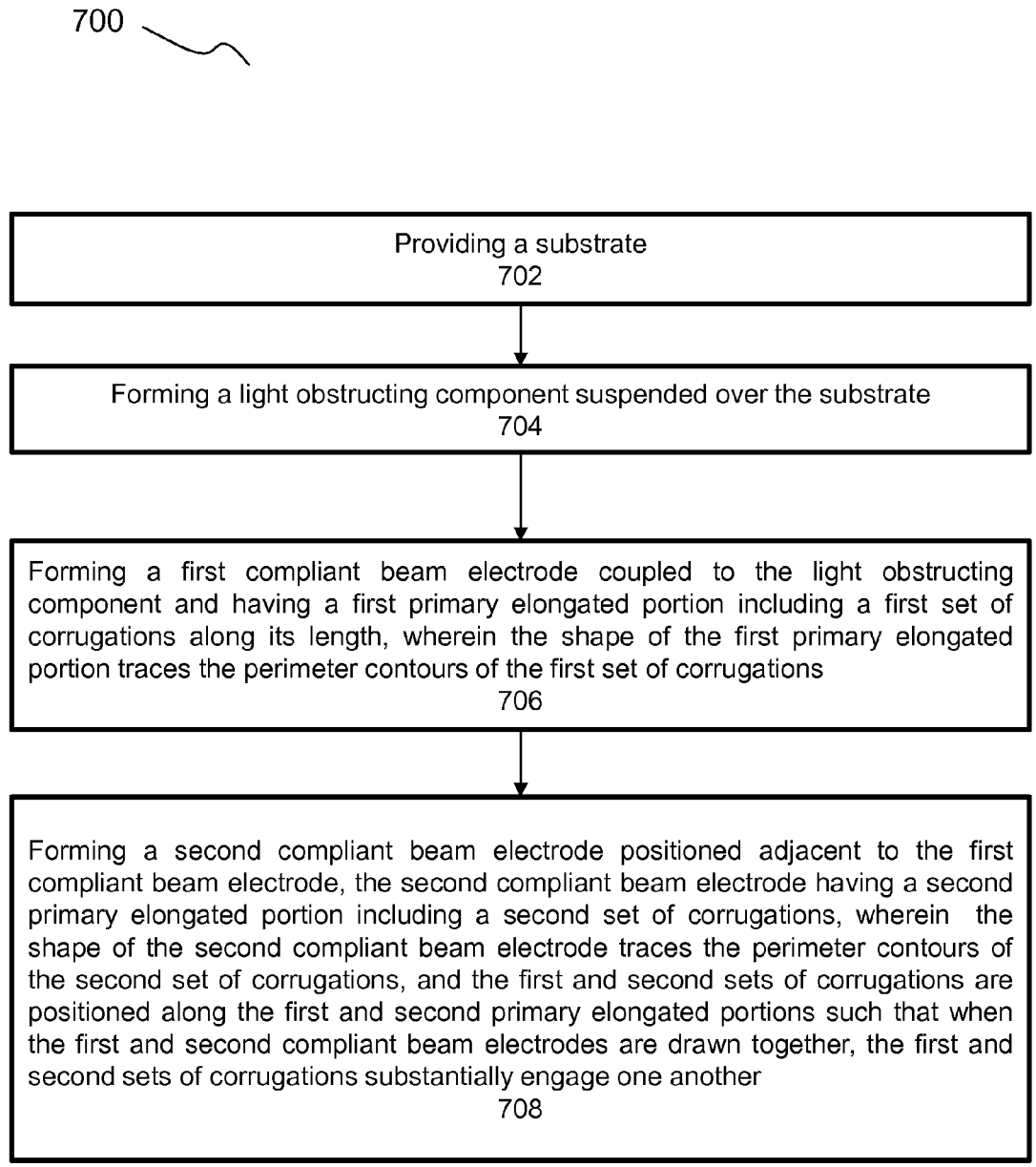
FIG. 7 shows a flow diagram of an example process of forming a display apparatus.

FIG. 7 shows a flow diagram of an example process 700 of forming a display apparatus. For example, the method 700 can be used to manufacture the electrostatically actuated light modulator 400, 401, 500, 501 or 600 shown in FIGS. 4A, 4B, 5A, 5B and 6. In brief overview, the process 700 includes providing a substrate (stage 702), forming a light obstructing component suspended over the substrate (stage 704), forming a first compliant beam electrode coupled to the light obstructing component (stage 706), and forming a second compliant beam electrode positioned adjacent the first compliant beam electrode (stage 708). The first compliant beam electrode is formed to have a first primary elongated portion including a first set of corrugations along its length and such that the shape of the electrode first primary elongated portion traces the perimeter contours of the first set of corrugations. The second compliant beam electrode is formed to have a second primary elongated portion including a second set of corrugations and such that the shape of the second compliant beam electrode traces the perimeter contours of the second set of corrugations. The first and second sets of corrugations are positioned along the first and second primary elongated portions such that when the first and second compliant beam electrodes are drawn together, the first and second sets of corrugations substantially engage one another.

The stages of the process 700 described above can be carried out generally according to the fabrication process depicted in FIGS. 3A-3D. In order to create the light obstructing component and the corrugated beams set forth in stages 704, 706, and 708, the second sacrificial material 305 shown in FIG. 3B is patterned to form vertical sidewalls that follow the contours of the desired corrugations. In contrast, the vertical sidewalls 309 shown in FIG. 3B are generally planar (or are slightly curved). Subsequently, when a shutter material is applied on top of the second sacrificial material 305, the shutter material coats the top surface of the second sacrificial material 305, the corrugated vertical sidewalls, and the exposed portions of the bottom horizontal level 308 of the mold 303 (shown in FIG. 3B without the corrugations). Upon applying an etchant (e.g., in an anistropic etch process as described above in relation to FIG. 3C) unwanted shutter material is removed. The mold can then be removed as discussed above in relation to FIG. 3D, leaving a light modulator that includes a light obstructing component (in this case a shutter), and first and second beam electrodes that include elongated portions that trace the contours of the corrugations that had been patterned into the vertical sidewalls of the mold 303.

Figure 8A:
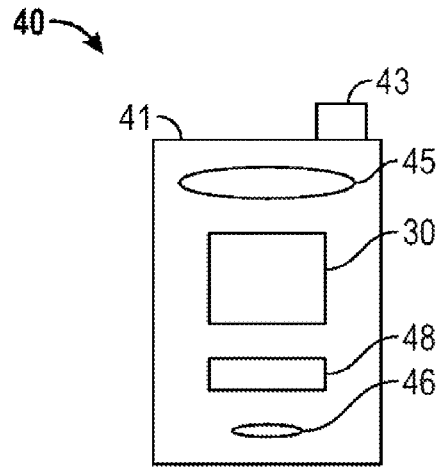
FIGS. 8A and 8B show system block diagrams of an example display device that includes a plurality of display elements.
Figure 8B:
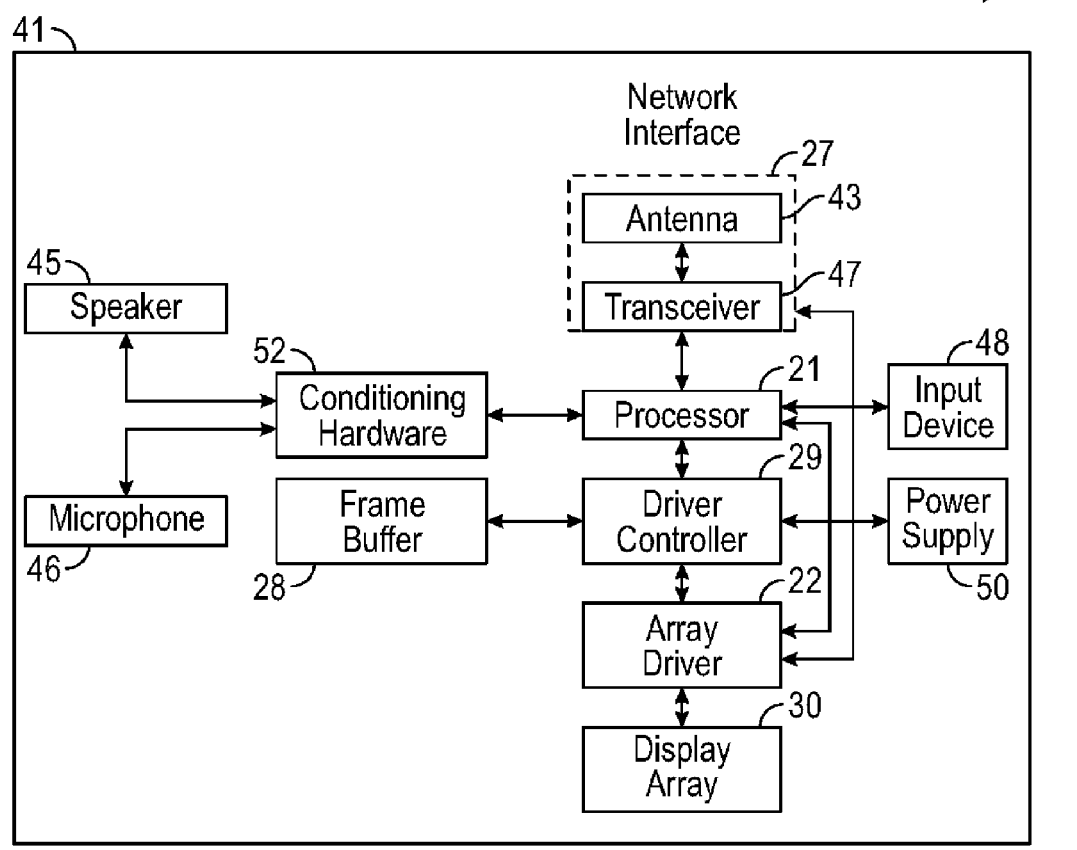

FIGS. 8A and 8B show system block diagrams of an example display device 40 that includes a plurality of display elements. The display device 40 can be, for example, a smart phone, a cellular or mobile telephone. However, the same components of the display device 40 or slight variations thereof are also illustrative of various types of display devices such as televisions, computers, tablets, e-readers, hand-held devices and portable media devices.

The display device 40 includes a housing 41, a display 30, an antenna 43, a speaker 45, an input device 48 and a microphone 46. The housing 41 can be formed from any of a variety of manufacturing processes, including injection molding, and vacuum forming. In addition, the housing 41 may be made from any of a variety of materials, including, but not limited to: plastic, metal, glass, rubber and ceramic, or a combination thereof. The housing 41 can include removable portions (not shown) that may be interchanged with other removable portions of different color, or containing different logos, pictures, or symbols.

The display 30 may be any of a variety of displays, including a bi-stable or analog display. The display 30 also can be configured to include a flat-panel display, such as plasma, electroluminescent (EL) displays, OLED, super twisted nematic (STN) display, LCD, or thin-film transistor (TFT) LCD, or a non-flat-panel display, such as a cathode ray tube (CRT) or other tube device. In addition, the display 30 can include a mechanical light modulator-based display, as described herein.

The components of the display device 40 are schematically illustrated in FIG. 8B. The display device 40 includes a housing 41 and can include additional components at least partially enclosed therein. For example, the display device 40 includes a network interface 27 that includes an antenna 43 which can be coupled to a transceiver 47. The network interface 27 may be a source for image data that could be displayed on the display device 40. Accordingly, the network interface 27 is one example of an image source module, but the processor 21 and the input device 48 also may serve as an image source module. The transceiver 47 is connected to a processor 21, which is connected to conditioning hardware 52. The conditioning hardware 52 may be configured to condition a signal (such as filter or otherwise manipulate a signal). The conditioning hardware 52 can be connected to a speaker 45 and a microphone 46. The processor 21 also can be connected to an input device 48 and a driver controller 29. The driver controller 29 can be coupled to a frame buffer 28, and to an array driver 22, which in turn can be coupled to a display array 30. One or more elements in the display device 40, including elements not specifically depicted in FIGS. 7A and 7B, can be configured to function as a memory device and be configured to communicate with the processor 21. In some implementations, a power supply 50 can provide power to substantially all components in the particular display device 40 design.

The network interface 27 includes the antenna 43 and the transceiver 47 so that the display device 40 can communicate with one or more devices over a network. The network interface 27 also may have some processing capabilities to relieve, for example, data processing requirements of the processor 21. The antenna 43 can transmit and receive signals. In some implementations, the antenna 43 transmits and receives RF signals according to the IEEE 16.11 standard, including IEEE 16.11(a), (b), or (g), or the IEEE 802.11 standard, including IEEE 802.11 a, b, g, n, and further implementations thereof. In some other implementations, the antenna 43 transmits and receives RF signals according to the Bluetooth® standard. In the case of a cellular telephone, the antenna 43 can be designed to receive code division multiple access (CDMA), frequency division multiple access (FDMA), time division multiple access (TDMA), Global System for Mobile communications (GSM), GSM/General Packet Radio Service (GPRS), Enhanced Data GSM Environment (EDGE), Terrestrial Trunked Radio (TETRA), Wideband-CDMA (W-CDMA), Evolution Data Optimized (EV-DO), 1×EV-DO, EV-DO Rev A, EV-DO Rev B, High Speed Packet Access (HSPA), High Speed Downlink Packet Access (HSDPA), High Speed Uplink Packet Access (HSUPA), Evolved High Speed Packet Access (HSPA+), Long Term Evolution (LTE), AMPS, or other known signals that are used to communicate within a wireless network, such as a system utilizing 3G, 4G or 5G technology. The transceiver 47 can pre-process the signals received from the antenna 43 so that they may be received by and further manipulated by the processor 21. The transceiver 47 also can process signals received from the processor 21 so that they may be transmitted from the display device 40 via the antenna 43.

In some implementations, the transceiver 47 can be replaced by a receiver. In addition, in some implementations, the network interface 27 can be replaced by an image source, which can store or generate image data to be sent to the processor 21. The processor 21 can control the overall operation of the display device 40. The processor 21 receives data, such as compressed image data from the network interface 27 or an image source, and processes the data into raw image data or into a format that can be readily processed into raw image data. The processor 21 can send the processed data to the driver controller 29 or to the frame buffer 28 for storage. Raw data typically refers to the information that identifies the image characteristics at each location within an image. For example, such image characteristics can include color, saturation and gray-scale level.

The processor 21 can include a microcontroller, CPU, or logic unit to control operation of the display device 40. The conditioning hardware 52 may include amplifiers and filters for transmitting signals to the speaker 45, and for receiving signals from the microphone 46. The conditioning hardware 52 may be discrete components within the display device 40, or may be incorporated within the processor 21 or other components.

The driver controller 29 can take the raw image data generated by the processor 21 either directly from the processor 21 or from the frame buffer 28 and can re-format the raw image data appropriately for high speed transmission to the array driver 22. In some implementations, the driver controller 29 can re-format the raw image data into a data flow having a raster-like format, such that it has a time order suitable for scanning across the display array 30. Then the driver controller 29 sends the formatted information to the array driver 22. Although a driver controller 29, such as an LCD controller, is often associated with the system processor 21 as a stand-alone Integrated Circuit (IC), such controllers may be implemented in many ways. For example, controllers may be embedded in the processor 21 as hardware, embedded in the processor 21 as software, or fully integrated in hardware with the array driver 22.

The array driver 22 can receive the formatted information from the driver controller 29 and can re-format the video data into a parallel set of waveforms that are applied many times per second to the hundreds, and sometimes thousands (or more), of leads coming from the display's x-y matrix of display elements. In some implementations, the array driver 22 and the display array 30 are a part of a display module. In some implementations, the driver controller 29, the array driver 22, and the display array 30 are a part of the display module.

In some implementations, the driver controller 29, the array driver 22, and the display array 30 are appropriate for any of the types of displays described herein. For example, the driver controller 29 can be a conventional display controller or a bi-stable display controller (such as a mechanical light modulator display element controller). Additionally, the array driver 22 can be a conventional driver or a bi-stable display driver (such as a mechanical light modulator display element controller). Moreover, the display array 30 can be a conventional display array or a bi-stable display array (such as a display including an array of mechanical light modulator display elements). In some implementations, the driver controller 29 can be integrated with the array driver 22. Such an implementation can be useful in highly integrated systems, for example, mobile phones, portable-electronic devices, watches or small-area displays.

In some implementations, the input device 48 can be configured to allow, for example, a user to control the operation of the display device 40. The input device 48 can include a keypad, such as a QWERTY keyboard or a telephone keypad, a button, a switch, a rocker, a touch-sensitive screen, a touch-sensitive screen integrated with the display array 30, or a pressure- or heat-sensitive membrane. The microphone 46 can be configured as an input device for the display device 40.

In some implementations, voice commands through the microphone 46 can be used for controlling operations of the display device 40.

The power supply 50 can include a variety of energy storage devices. For example, the power supply 50 can be a rechargeable battery, such as a nickel-cadmium battery or a lithium-ion battery. In implementations using a rechargeable battery, the rechargeable battery may be chargeable using power coming from, for example, a wall socket or a photovoltaic device or array. Alternatively, the rechargeable battery can be wirelessly chargeable. The power supply 50 also can be a renewable energy source, a capacitor, or a solar cell, including a plastic solar cell or solar-cell paint. The power supply 50 also can be configured to receive power from a wall outlet.

In some implementations, control programmability resides in the driver controller 29 which can be located in several places in the electronic display system. In some other implementations, control programmability resides in the array driver 22. The above-described optimization may be implemented in any number of hardware and/or software components and in various configurations.

As used herein, a phrase referring to "at least one of" a list of items refers to any combination of those items, including single members. As an example, "at least one of: a, b, or c" is intended to cover: a, b, c, a-b, a-c, b-c, and a-b-c.

The various illustrative logics, logical blocks, modules, circuits and algorithm processes described in connection with the implementations disclosed herein may be implemented as electronic hardware, computer software, or combinations of both. The interchangeability of hardware and software has been described generally, in terms of functionality, and illustrated in the various illustrative components, blocks, modules, circuits and processes described above. Whether such functionality is implemented in hardware or software depends upon the particular application and design constraints imposed on the overall system.

The hardware and data processing apparatus used to implement the various illustrative logics, logical blocks, modules and circuits described in connection with the aspects disclosed herein may be implemented or performed with a general purpose single- or multi-chip processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, or, any conventional processor, controller, microcontroller, or state machine. A processor also may be implemented as a combination of computing devices, such as a combination of a DSP and a microprocessor, a plurality of microprocessors, one or more microprocessors in conjunction with a DSP core, or any other such configuration. In some implementations, particular processes and methods may be performed by circuitry that is specific to a given function.

Various modifications to the implementations described in this disclosure may be readily apparent to those skilled in the art, and the generic principles defined herein may be applied to other implementations without departing from the spirit or scope of this disclosure. Thus, the claims are not intended to be limited to the implementations shown herein, but are to be accorded the widest scope consistent with this disclosure, the principles and the novel features disclosed herein.

Additionally, a person having ordinary skill in the art will readily appreciate, the terms "upper" and "lower" are sometimes used for ease of describing the figures, and indicate relative positions corresponding to the orientation of the figure on a properly oriented page, and may not reflect the proper orientation of any device as implemented.

Certain features that are described in this specification in the context of separate implementations also can be implemented in combination in a single implementation. Conversely, various features that are described in the context of a single implementation also can be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Further, the drawings may schematically depict one more example processes in the form of a flow diagram. However, other operations that are not depicted can be incorporated in the example processes that are schematically illustrated. For example, one or more additional operations can be performed before, after, simultaneously, or between any of the illustrated operations. In certain circumstances, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products. Additionally, other implementations are within the scope of the following claims. In some cases, the actions recited in the claims can be performed in a different order and still achieve desirable results.

What is claimed is:

1. A display apparatus, comprising:
a light obstructing component suspended over a substrate; and
an actuator configured to move the light obstructing component in a plane substantially parallel to the substrate, the actuator including:
a first compliant beam electrode coupled to the light obstructing component and having a first primary elongated portion including a first set of corrugations along a length of the first compliant beam electrode, wherein the first compliant beam electrode defines a perimeter of the first set of corrugations; and
a second compliant beam electrode positioned adjacent to the first compliant beam electrode, the second compliant beam electrode having a second primary elongated portion including a second set of corrugations, wherein the second compliant beam electrode defines a perimeter of the second set of corrugations, and the first and second sets of corrugations are positioned along the first and second primary elongated portions at positions selected such that when the first and second compliant beam electrodes are drawn together, the first and second sets of corrugations substantially engage one another.

2. The display apparatus of claim 1, wherein:
the second primary elongated portion of the second compliant beam electrode extends outward from an anchor supporting the second compliant beam electrode over the substrate, and the second compliant beam electrode further includes a third primary elongated portion extending back from the distal end of the second primary elongated portion towards the anchor.

3. The display apparatus of claim 2, wherein the third primary elongated portion includes a third set of corrugations along a length of the third primary elongated portion.

4. The display apparatus of claim 1, wherein each of the first and second sets of corrugations includes a plurality of protrusions having depths which are at least four times their respective thicknesses.

5. The display apparatus of claim 4, wherein each of the protrusions in the first and second sets of corrugations is spaced at least about 3 microns apart from a nearest adjacent protrusion along the respective lengths of the first and second primary elongated portions of the first and second compliant beam electrodes.

6. The display apparatus of claim 1, wherein protrusions in the first and second sets of corrugations are one of triangular, rectangular, or U-shaped.

7. The display apparatus of claim 1, wherein the first compliant beam electrode and the second compliant beam electrode are configured to be drawn together in response to a voltage applied across the first and second compliant beam electrodes.

8. The display apparatus of claim 1, wherein the first compliant beam electrode and the second compliant beam electrode are configured to be drawn together in a plane substantially parallel to the substrate.

9. The display apparatus of claim 1, further comprising:
a display;
a processor that is configured to communicate with the display, the processor being configured to process image data; and
a memory device that is configured to communicate with the processor.

10. The display apparatus of claim 9, further comprising:
a driver circuit configured to send at least one signal to the display; and
a controller configured to send at least a portion of the image data to the driver circuit.

11. The display apparatus of claim 9, further comprising:
an image source module configured to send the image data to the processor, wherein the image source module comprises at least one of a receiver, transceiver, and transmitter.

12. The display apparatus of claim 9, further comprising:
an input device configured to receive input data and to communicate the input data to the processor.

13. A method of forming a display apparatus, comprising:
providing a substrate;
forming a light obstructing component suspended over the substrate;
forming a first compliant beam electrode coupled to the light obstructing component and having a first primary elongated portion including a first set of corrugations along its length, wherein the shape of the first primary elongated portion traces the perimeter contours of the first set of corrugations; and
forming a second compliant beam electrode positioned adjacent to the first compliant beam electrode, the second compliant beam electrode having a second primary elongated portion including a second set of corrugations, wherein the shape of the second compliant beam electrode traces the perimeter contours of the second set of corrugations, and the first and second sets of corrugations are positioned along the first and second primary elongated portions such that when the first and second compliant beam electrodes are drawn together, the first and second sets of corrugations substantially engage one another.

14. The method of claim 13, further comprising forming a rear elongated portion for the second compliant beam electrode that loops back to an anchor supporting the second compliant beam electrode over the substrate.

15. The method of claim 14, further comprising forming a third set of corrugations along the rear elongated portion.

16. The method of claim 13, wherein each of the first and second sets of corrugations includes a plurality of protrusions having a depth greater than their respective width.

17. The method of claim 13, wherein the first set of corrugations and the second set of corrugations include protrusions that are one of triangular, rectangular, or U-shaped.

18. A display apparatus comprising:
a light obstructing component suspended over a substrate; and
an actuator configured to move the light obstructing component in a plane substantially parallel to the substrate, the actuator including:
a first compliant beam electrode coupled to the light obstructing component and having a first primary elongated portion, wherein the first compliant beam electrode defines a perimeter of the first primary elongated portion;
a second compliant beam electrode positioned adjacent to the first compliant beam electrode, the second compliant beam electrode having a second primary elongated portion, wherein the second compliant beam electrode defines a perimeter of the second elongated portion;
wherein the first and second compliant beam electrodes include:
means for generating a first electromotive force resulting from an electric field acting substantially perpendicular to a direction of movement; and
means for generating a second electromotive force resulting from fringing fields acting substantially parallel to the direction of movement, wherein the first and second electromotive forces draw the first and second compliant beam nodes together.

19. The display apparatus of claim 18, wherein:
the first compliant beam electrode and the second compliant beam electrode are configured to be drawn together in a plane substantially parallel to the substrate.

20. The display apparatus of claim 18, wherein:
the second primary elongated portion of the second compliant beam electrode extends outward from an anchor supporting the second compliant beam electrode over the substrate, and
the second compliant beam electrode further includes a third primary elongated portion extending back from the distal end of the second primary elongated portion towards the anchor.

* * * * *